United States Patent [19]

Johnson et al.

[11] 4,185,323
[45] Jan. 22, 1980

[54] DYNAMIC MEMORY SYSTEM WHICH INCLUDES APPARATUS FOR PERFORMING REFRESH OPERATIONS IN PARALLEL WITH NORMAL MEMORY OPERATIONS

[75] Inventors: Robert B. Johnson, Billerica; Chester M. Nibby, Jr., Peabody, both of Mass.

[73] Assignee: Honeywell Information Systems Inc., Waltham, Mass.

[21] Appl. No.: 926,480

[22] Filed: Jul. 20, 1978

[51] Int. Cl.² ............................................. G11C 13/00
[52] U.S. Cl. ..................................... 365/222; 307/238
[58] Field of Search ......................... 365/222; 307/238

[56] References Cited

U.S. PATENT DOCUMENTS

| | | | |
|---|---|---|---|
| 3,737,879 | 6/1973 | Greene et al. | 365/222 |
| 3,790,961 | 2/1974 | Palfi et al. | 365/222 |
| 4,028,675 | 6/1977 | Frankenberg | 365/222 |

*Primary Examiner*—Terrell W. Fears
*Attorney, Agent, or Firm*—Faith F. Driscoll; Nicholas Prasinos; Ronald T. Reiling

[57] ABSTRACT

A memory subsystem for processing memory requests includes at least a pair of independently addressable dynamic memory module units. Each memory unit includes arrays of memory elements corresponding to a number of storage locations, separate addressing and data output circuits. The system further includes common timing, refresh and control circuits. When the memory request specifies a predetermined type of memory operation, the control circuits generate signals for refreshing a location within the memory unit from which data is not being fetched. The control circuits, upon the completion of the refresh operation, in response to another predetermined memory request, refreshes the corresponding row within the other unit in parallel with fetching data from first unit. Upon completing refresh operations within both units, the control circuits generate a control signal for inhibiting the refresh circuits from performing a mandatory refresh operation, upon a row of memory elements within the memory units in which access to the memory system is inhibited temporarily, enabling memory operations to continue without interruption.

38 Claims, 11 Drawing Figures

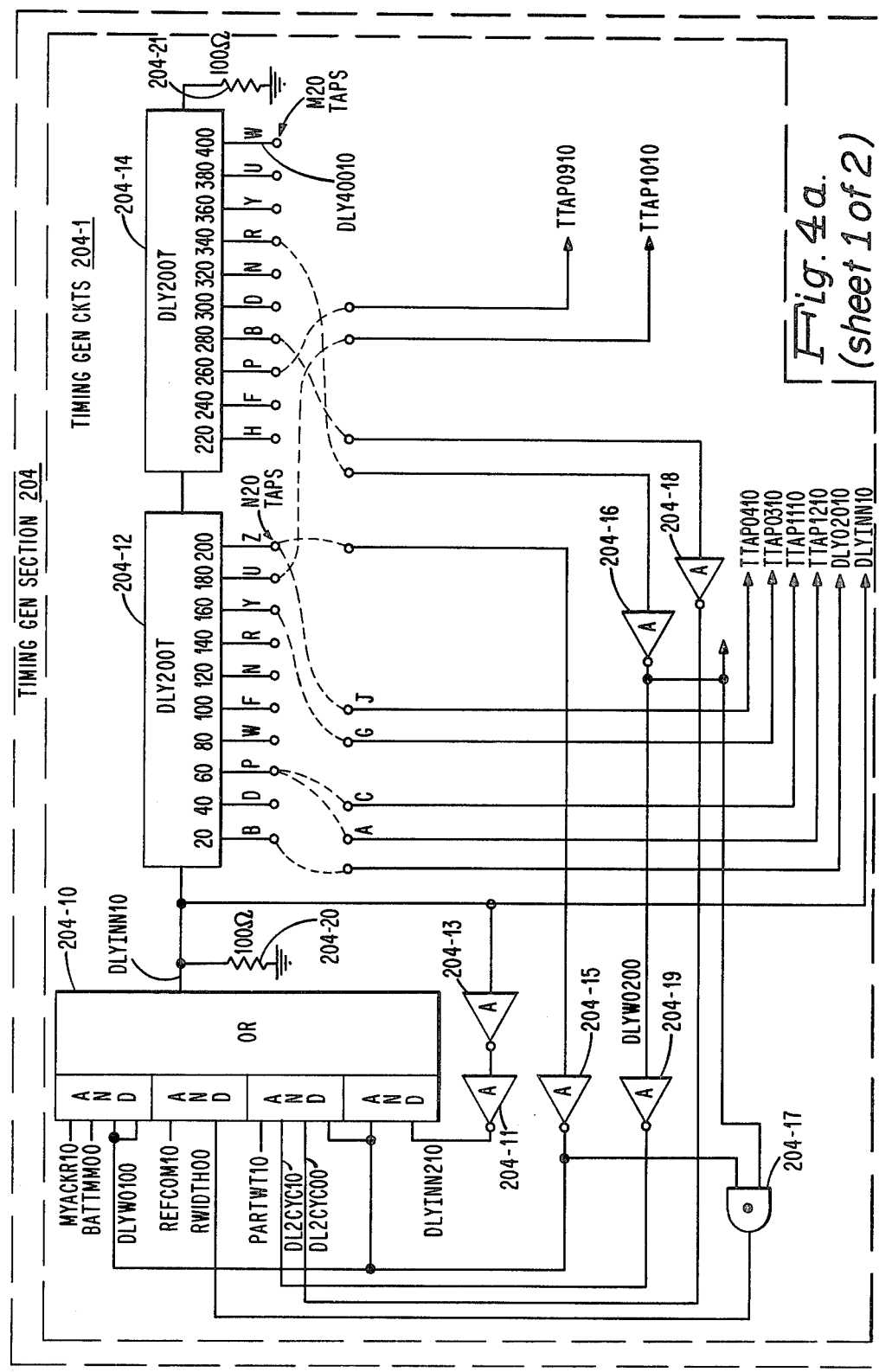
Fig. 4a. (sheet 1 of 2)

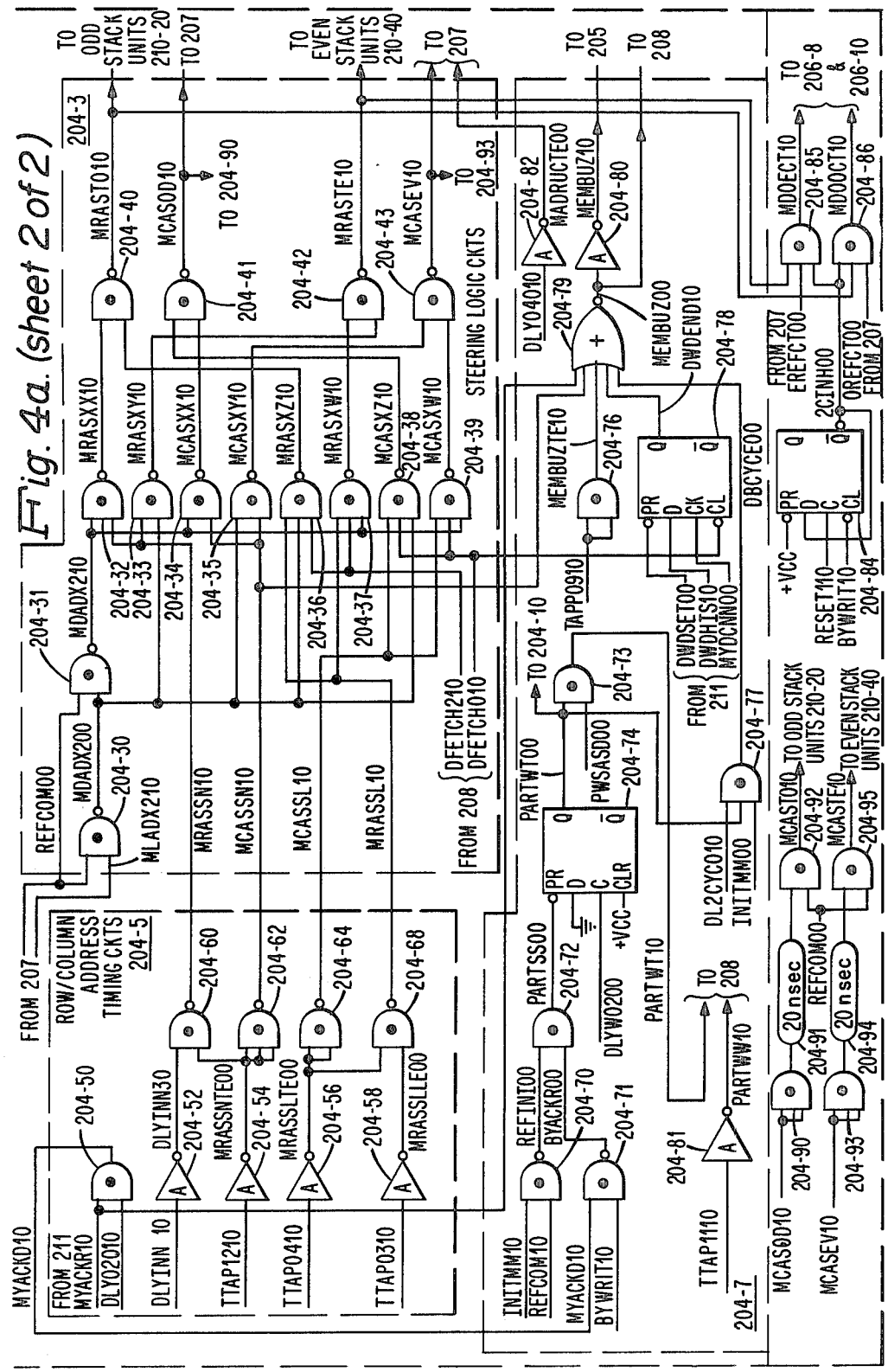
Fig. 4a. (sheet 2 of 2)

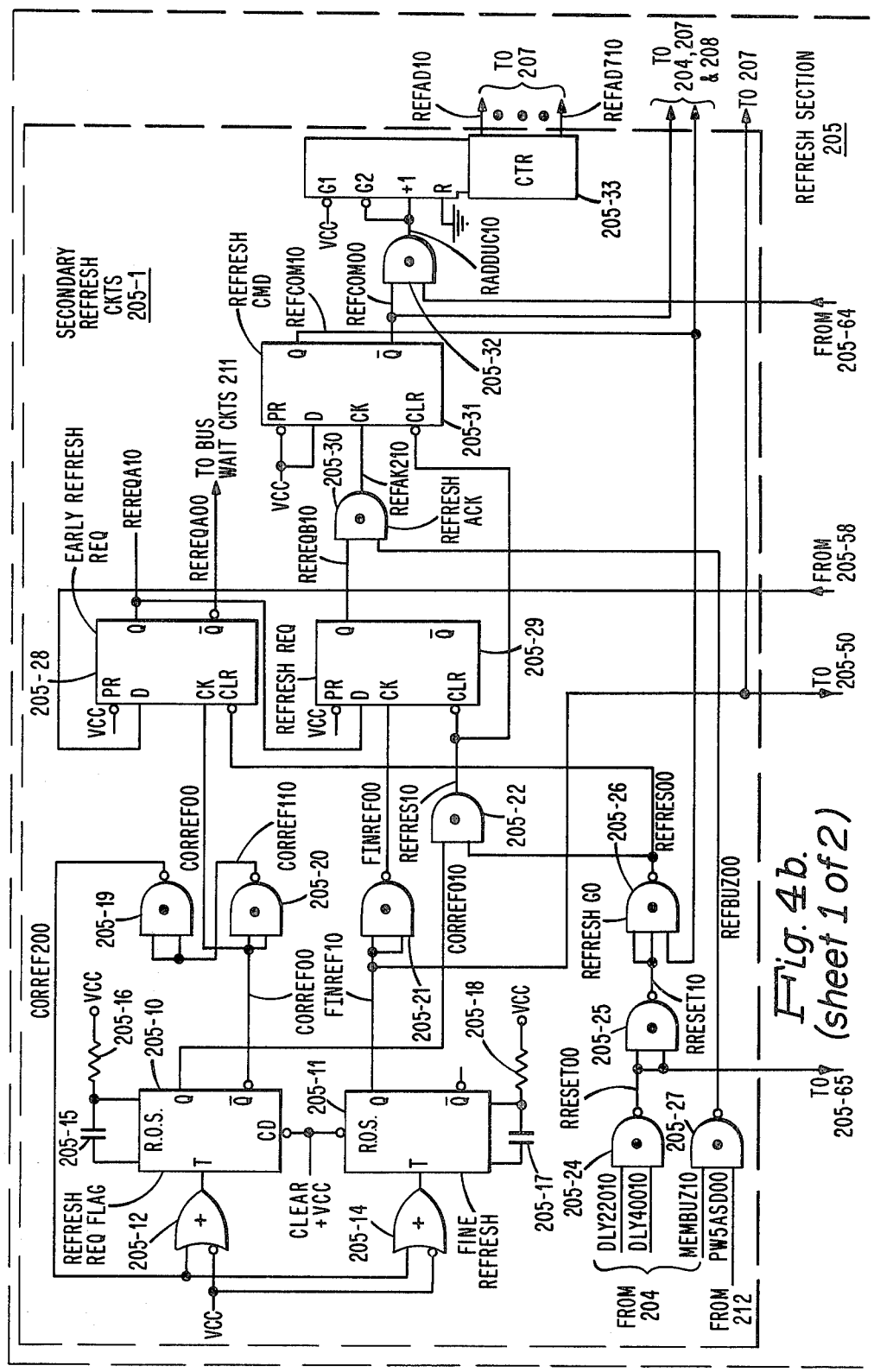
Fig. 4b. (sheet 1 of 2)

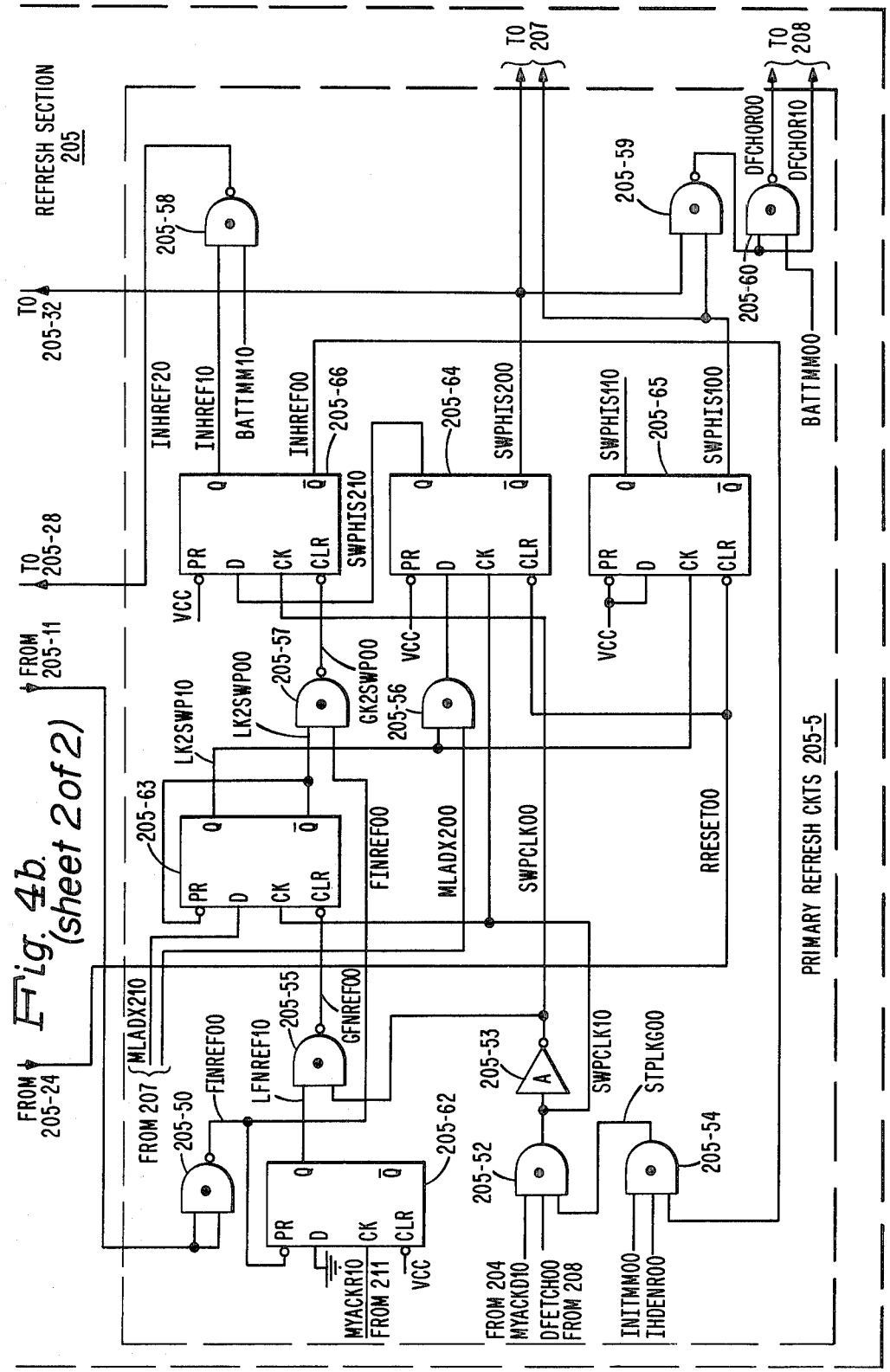
Fig. 4b. (sheet 2 of 2)

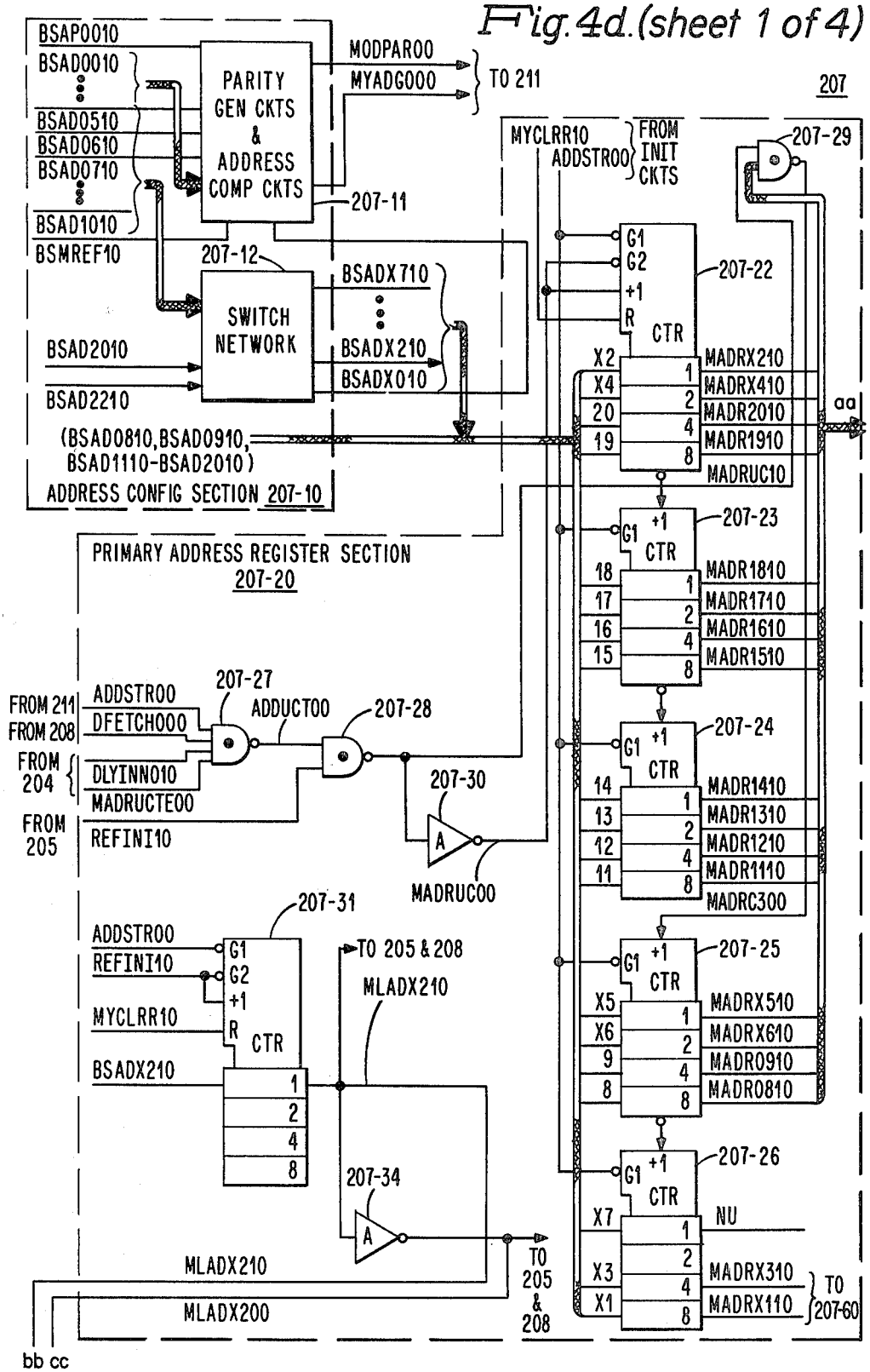
Fig.4d.(sheet 1 of 4)

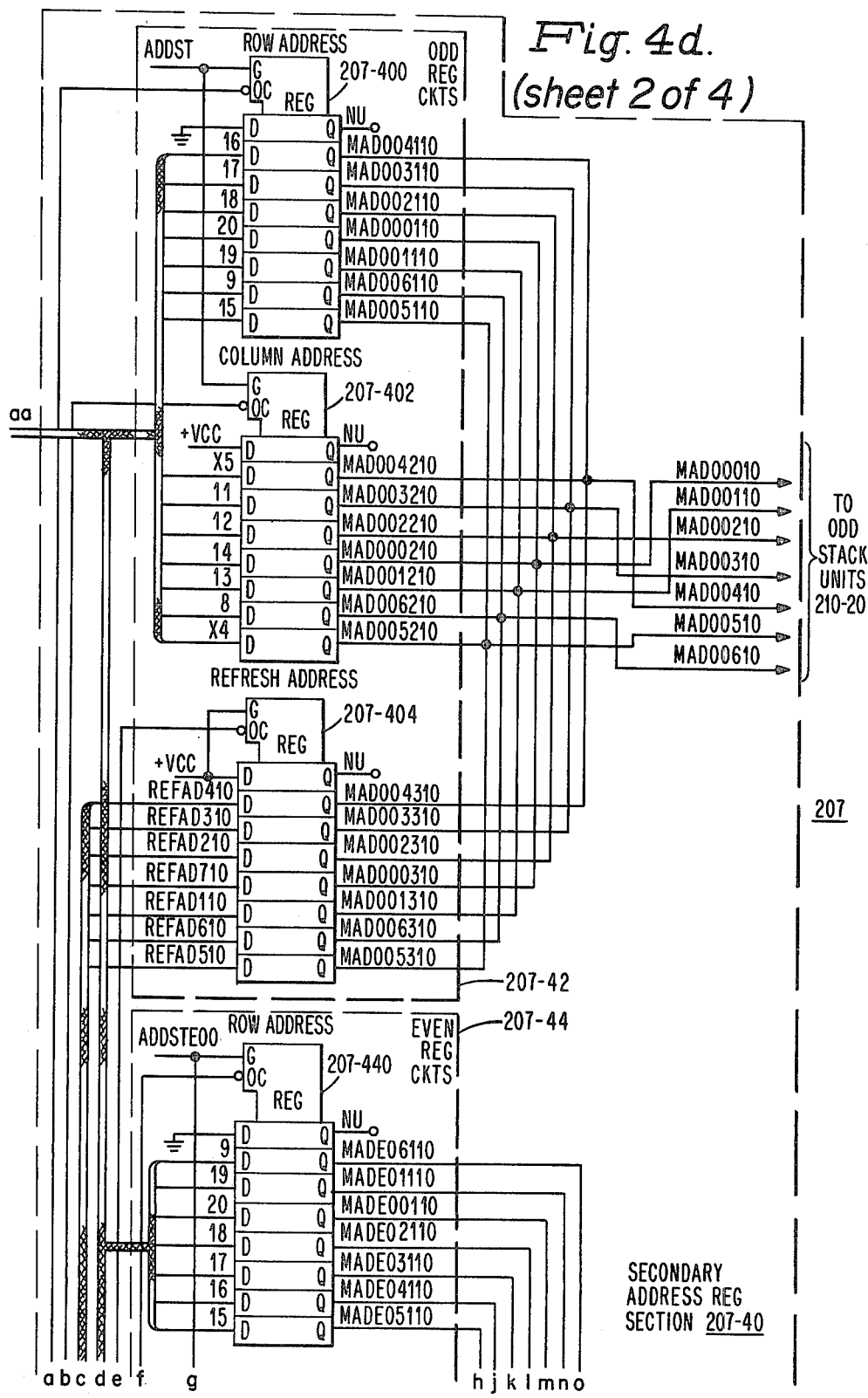
Fig. 4d. (sheet 2 of 4)

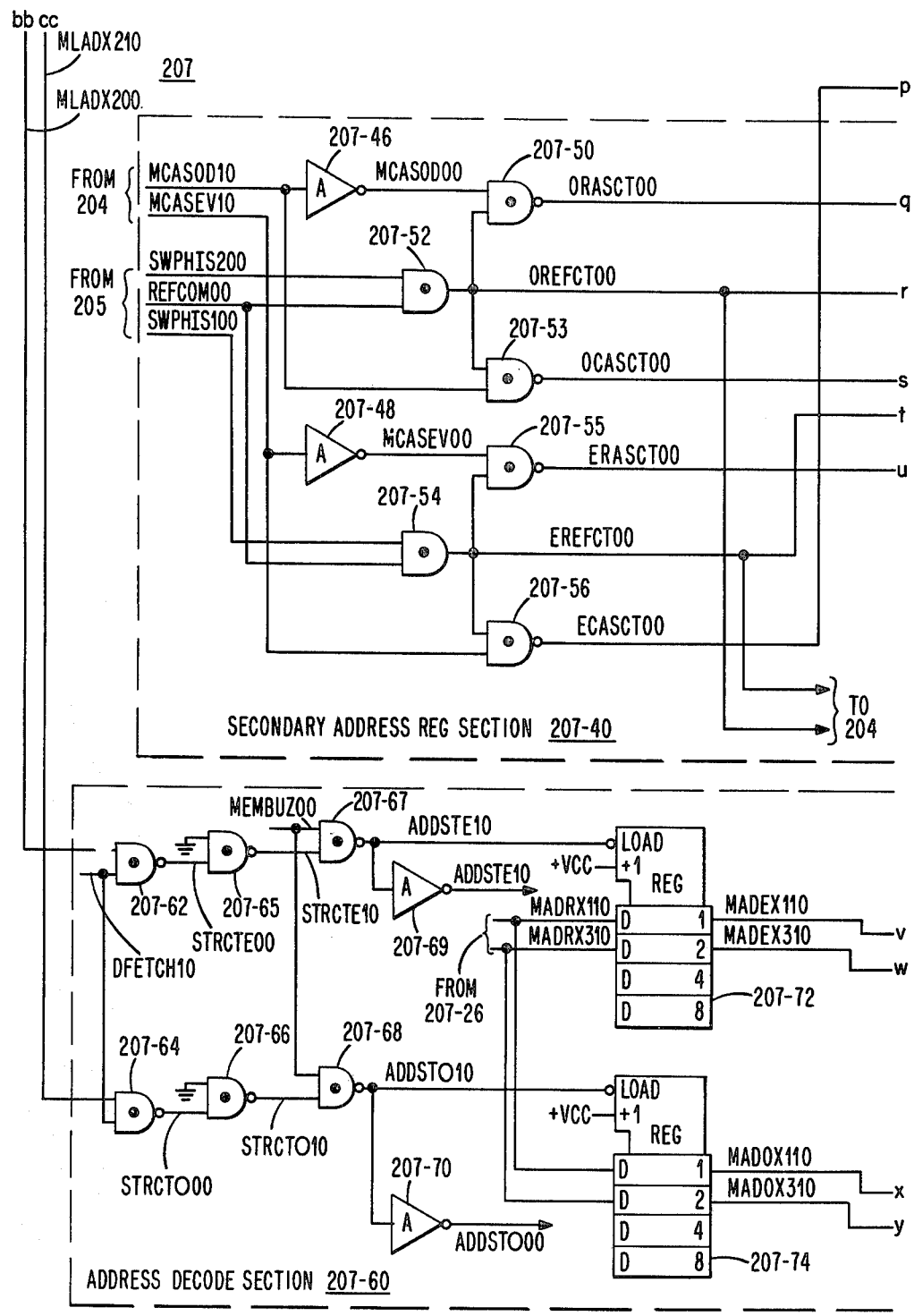
Fig. 4d. (sheet 3 of 4)

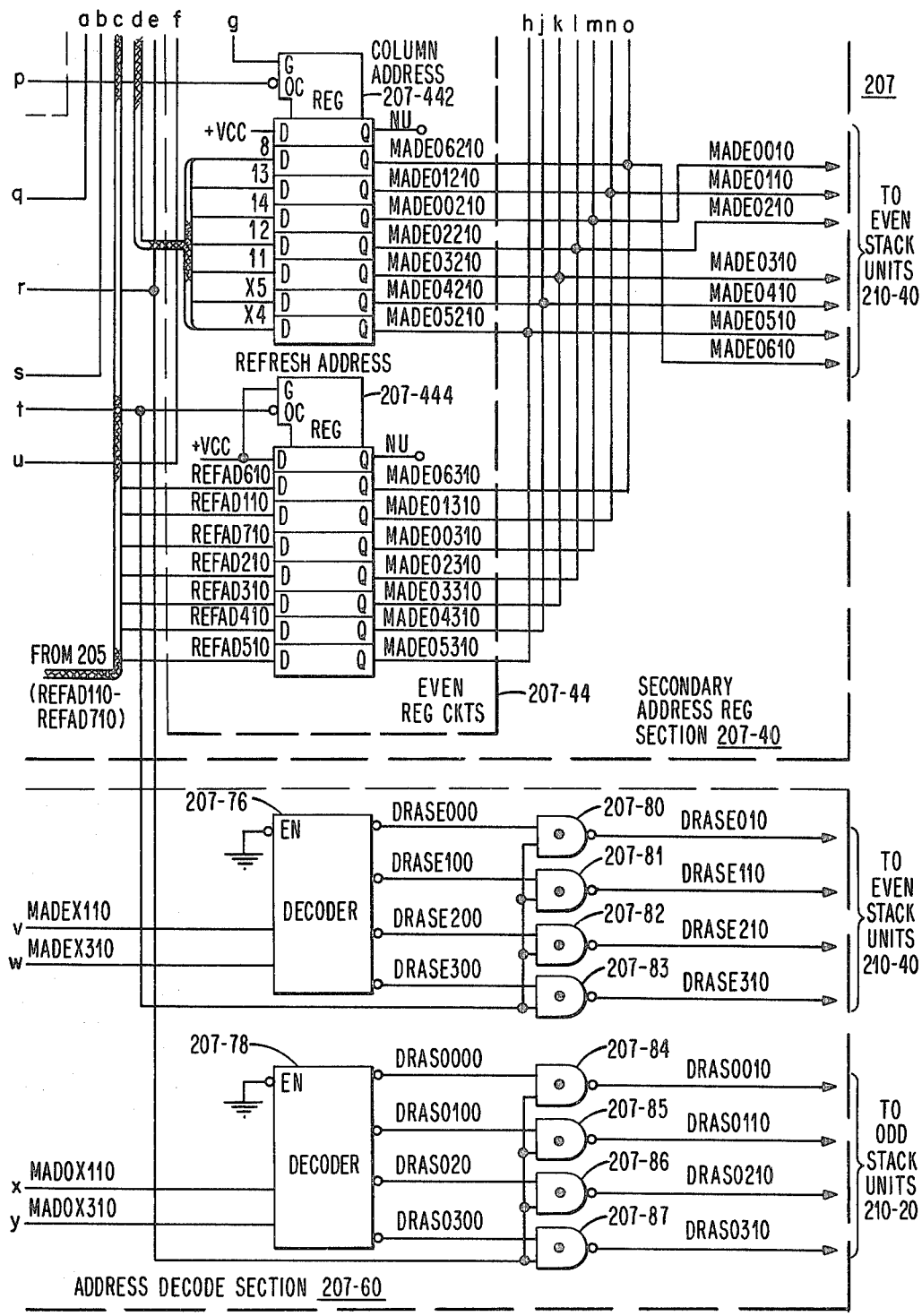
Fig. 4d. (sheet 4 of 4)

| BUS CYCLES | STATES OF KEY CONTROL LINES | | | | OPERATION | NO. OF CYCLES | MASTER | SLAVE | ADDRESS LINES (BSAD) | | | | DATA LINES (BSDT) | | | |
|---|---|---|---|---|---|---|---|---|---|---|---|---|---|---|---|---|
| | BSDBPL | BSWRIT | BSSHBC | BSMREF | | | | | 0 | | | 23 | 0 | | | 15 |
| A | F | T | F | T | MEMORY WRITE | 1 | CPU | MEM | ADDRESS | | | | DATA | | | |
| B | F | F | F | T | MEMORY READ | 1ST CYCLE | CPU | MEM | ADDRESS | | | | 0    9 10         15 MASTER CHANNEL NUMBER / FUNCTION CODE | | | |
| | F | F | T | F | SINGLE WORD PULL/FETCH (RESPONSE) | 2ND CYCLE | MEM | CPU | 0    7 8      17 18      23 SLAVE CHANNEL NUMBER / FUNCTION CODE | | | | DATA | | | |
| C | T | F | F | T | MEMORY READ | 1ST CYCLE | CPU | MEM | ADDRESS | | | | 0    9 10         15 MASTER CHANNEL NUMBER / FUNCTION CODE | | | |
| | T | F | T | F | DOUBLE WORD RESPONSE PULL BOTH WORDS IN MEMORY | 2ND CYCLE | MEM | CPU | 0    7 8      17 18      23 SLAVE CHANNEL NUMBER / FUNCTION CODE | | | | DATA (FIRST WORD) | | | |
| | F | F | T | F | | 3RD CYCLE | MEM | CPU | 0    7 8      17 18      23 SLAVE CHANNEL NUMBER / FUNCTION CODE | | | | DATA (SECOND WORD) | | | |
| | F | F | T | F | RESPONSE SECOND WORD NOT IN MEMORY | 2ND CYCLE | MEM | CPU | 0    7 8      17 18      23 SLAVE CHANNEL NUMBER / FUNCTION CODE | | | | DATA (FIRST WORD) | | | |
| D | F | T | F | T | MEMORY WRITE | 1 | CPU | MEM | BYTE ADDRESS | | | | DATA | DATA | | |

Fig. 6.

DYNAMIC MEMORY SYSTEM WHICH INCLUDES APPARATUS FOR PERFORMING REFRESH OPERATIONS IN PARALLEL WITH NORMAL MEMORY OPERATIONS

RELATED APPLICATIONS

1. "System Providing Multiple Fetch Bus Cycle Operation" invented by John L. Curley, Robert B. Johnson, Richard A. Lemay and Chester M. Nibby, Jr., Ser. No. 867,270, filed on Jan. 5, 1978 and assigned to the same assignee as named herein.
2. "Method and Printed Circuit Board Apparatus which Facilitates Fabrication of Units Comprising a Data Processing System" invented by Robert B. Johnson and Chester M. Nibby, Jr., Ser. No. 856,433, filed on Dec. 1, 1977 and assigned to the same assignee as named herein.
3. "High Speed Buffer Memory With Word Prefetch" invented by Thomas F. Joyce and Thomas O. Holtey, Ser. No. 863,095, filed on Dec. 22, 1977 and assigned to the same assignee as named herein.

BACKGROUND OF THE INVENTION

1. Field of Use

This invention relates to memory systems containing memory elements in which information stored in the elements must be periodically refreshed or restored in order to preserve the integrity of such information. Such elements are normally termed volatile.

2. Prior Art

Apparatus which periodically restores information in volatile memory elements is well known. Normally, such apparatus restores information by either interleaving restoration with normal memory operations or in a burst mode by interrupting normal memory operations.

It has been noted that types of arrangements interfere with normal memory operation while restoration takes place. To eliminate such interference, one arrangement permits periodic restoration to be carried internally to the memory simultaneously with a normal memory access operation (i.e., read or write operation) and on a time ordered basis of previous restoration when no access to the memory is being made. To accomplish this, the array of memory elements is divided into a plurality of segments and the means for restoring information in the elements is actuated for a particular segment of the array each time an access to a portion of the array within that segment is made. The arrangement is disclosed in U.S. Pat. No. 3,811,117.

While the arrangement does not interfere with system operation in usual situations, there are times when it may not be possible to carry out all restore operations without disturbing normal memory operation. According to the patent, this arises when the memory system is accessing a few storage devices a high percentage of the cycle time intervals for the memory and accesses are being made to the memory in a high percentage of the access time intervals.

Another arrangement for refreshing memory elements of a memory containing a large number of rows makes use of refreshing cycles in parallel with a normal read-write memory operation. The memory array is divided into two blocks and when a central processing unit assigns a cycle for read-write operation to one block, the same cycle is utilized to refresh a row of memory elements of the other block. This arrangement is disclosed in U.S. patent application titled "Semiconductor Dynamic Memory and Related Refreshing System", Ser. No. 714,177, filed on Sept. 10, 1975 now U.S. Pat. No. 4,106,108 and assigned to Honeywell Information Systems Italia.

While the above arrangement reduces memory interference, there is a requirement for organizing the memory in a particular fashion which results in less flexibility and additional circuit complexity.

Additionally, because of the organizational constraints mentioned, the arrangements discussed above are not suitable for utilization in memory systems which include a plurality of modules for implementing a double word fetch access capability. The term double word fetch access as used herein refers to the capability of being able to access a pair of words at a time from a memory system during a cycle of operation.

Accordingly, it is a primary object of the present invention to provide a memory system whose memory elements are refreshed with a minimum of interference to memory operations.

It is a further object of the present invention to provide apparatus for refreshing the memory elements of a plurality of modules of a memory system constructed to incorporate a double word fetch capability.

SUMMARY OF THE INVENTION

The above and other objects are achieved in a preferred embodiment of the memory system of the present invention which includes at least a pair of independently addressable memory module units. Each memory module unit includes separate address and data output circuits and are accessed in an interleaved fashion. That is, memory requests are directed to the memory module units alternately rather than to a single memory module unit over a period of memory cycles.

The memory system further includes common timing and refresh circuits operative during a memory cycle of operation to refresh a particular row of memory elements within the arrays of the pair of addressable module units. The refresh circuits include control circuits which, in response to each request not specifying a double fetch access (i.e., single fetch access), refreshes one of the rows of the memory arrays of the memory module unit from which information is not being accessed.

Upon the receipt of a subsequent memory request specifying a single fetch access to the other memory module unit, the control circuits refresh a corresponding one of the rows of the memory arrays within that other unit.

Upon completing the refreshing of a entire row of memory elements within both units, the control circuits generate signals which inhibit the refresh circuits from performing a mandatory refresh operation on a row of memory elements of memory units in which access to the memory system is inhibited.

The above arrangement permits refresh operations to be carried out in parallel with memory access operations without altering the performance of the memory system. However, this assumes that there are at least two single fetch accesses made to the different memory module units (i.e., at sequential addresses) within the time interval during which a mandatory refresh operation must be performed. More importantly, by utilizing those memory cycles not requiring double fetch accesses, the arrangement of the preferred embodiment minimizes the amount of additional circuits required for refreshing memory elements without interference with normal memory operations.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 4a through 4d illustrate in greater detail different portions of the memory subsystem 20 of FIG. 3.

FIG. 6 illustrates the formats of signals applied to the system bus of FIG. 1.

GENERAL DESCRIPTION OF SYSTEM OF FIG. 1

Figure 1:
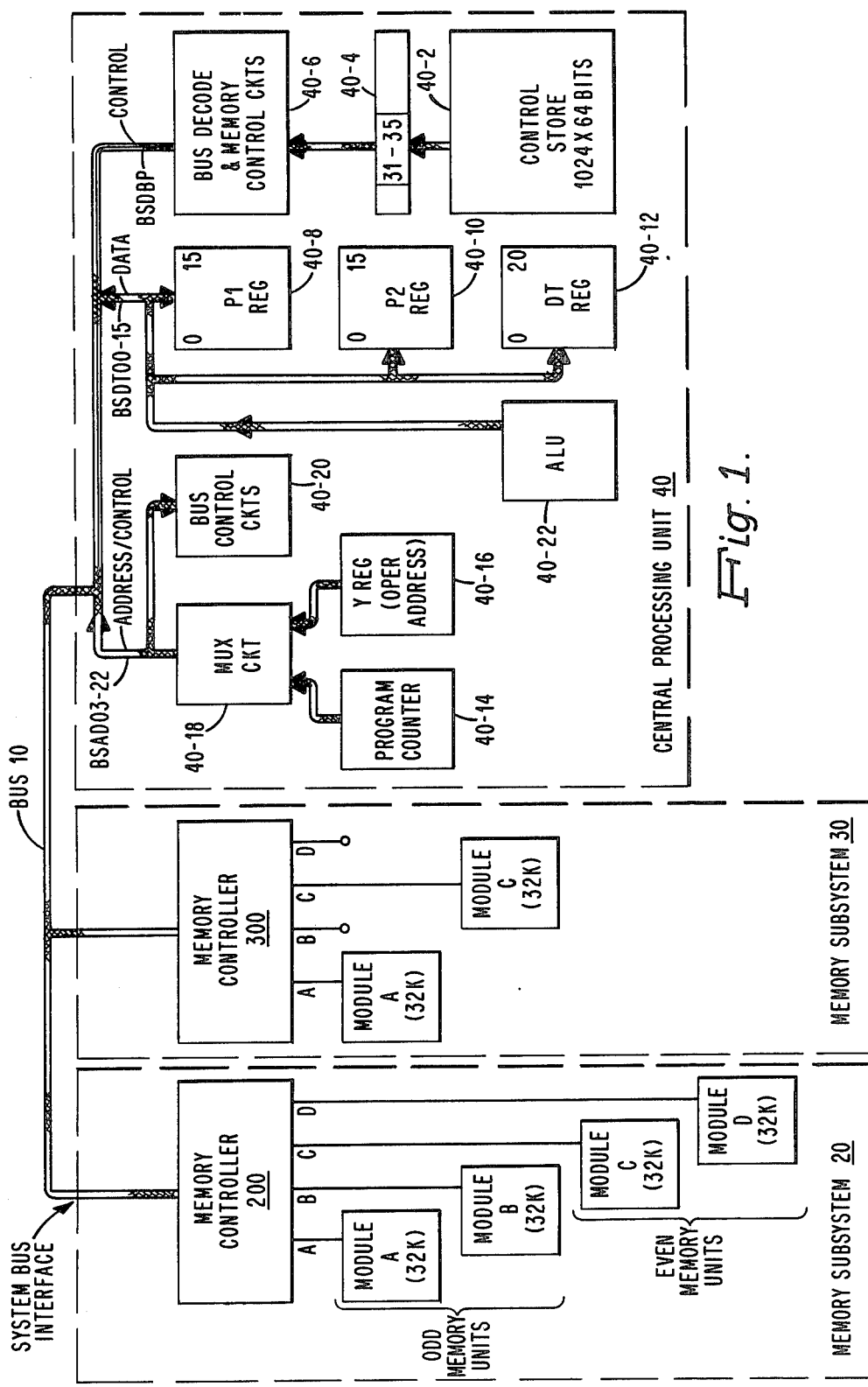
FIG. 1 shows in block diagram form a system which incorporates the principles of the present invention.

FIG. 1 illustrates a data processing system which includes the apparatus of the present invention. Referring to the figure, it is seen that the system includes a multiline bus 10 coupled to a plurality of memory subsystems 20 and 30 and to a central processing unit (CPU) 40. It will be appreciated that the system of FIG. 1 will normally include other units such as those disclosed in U.S. Pat. No. 4,000,485 issued Dec. 28, 1976. The memory subsystems 20 and 30, each include a memory controller which can address up to four memory module units. In FIG. 1, memory controller 200 is connected to address module units labeled A through D while memory controller 300 is connected to address the module units labeled A and C.

The CPU 40 is operated under control of a microprogrammable control unit which includes a control store 40-2, an output register 40-4 and decode and control circuits 40-6. The control store 40-2 is organized to have a maximum of 1,024 words, each word containing 64 bits. Different groups of words correspond to groups of microinstructions coded for executing program instructions. Each microinstruction word has a format such as that disclosed in the patent application of David A. Cushing titled "Apparatus for Performing Floating Point Arithmetic Operations Using Submultiple Storage" bearing U.S. Ser. No. 815,891, filed on July 15, 1977 now U.S. Pat. No. 4,130,879.

The particular word format as illustrated in the Figure includes a bus control field which corresponds to bits 31-35. These bits are coded to generate signals for specifying the particular type of operation required for the execution of the different program instructions being processed by CPU 40. Additionally, as explained herein, the bits generate signals for applying the appropriate address to bus 10 as explained herein. For example, those program instructions specifying operations including fetching instructions or procedure words from memory each cause the accessing and read out of a microinstruction word from control store 40-2 in which bits 31-35 are coded to specify a single word fetch memory read operation. Other program instructions such as those specifying the fetching of operands or data from memory each cause the read out of a microinstruction word from control store 40-2 in which bits 31-35 are coded to specify a double word fetch memory read operation. The types of instruction specified operations and corresponding memory requests will be discussed in greater detail with respect to FIG. 6.

As seen from FIG. 1, CPU 40 includes a number of registers 40-8 through 40-16 arranged as shown. The program counter register 40-14 normally stores the address of the program instruction currently being executed by CPU 40 while the Y register 40-16 normally contains the address of an operand. Both registers 40-14 and 40-16 are connected to different sets of input terminals of a multiplexer circuit 40-18, the output of which is applied to the address lines of bus 10.

The registers 40-8 and 40-10 couple to the data lines of bus 10 and are used to store instruction or procedure words received from memory in response to double word fetch memory requests. The register 40-12 similarly couples to the data lines of bus 10 and is used to store a data word or operand word received from memory in response to a single word fetch memory request.

As also seen from FIG. 1, CPU 40 further includes bus control circuits 40-20 and an arithmetic and logic unit (ALU) 40-22 which couple to the address and data lines respectively of bus 10. The ALU 40-22 normally applies operands or data to be written into memory. The ALU 40-22 can be considered conventional in design and may take the form of the unit disclosed in the Cushing application. The bus control circuits 40-20 include circuits similar to those disclosed in U.S. Pat. No. 4,000,485 which verify or check control information received from the address lines for indicating to the CPU 40 the type of identity of the source and memory request being responded to by memory (i.e., double fetch or single fetch memory request) as explained herein.

The CPU 40 and memory subsystems 20 and 30 communicate over the bus 10 in a predetermined manner as set forth in U.S. Pat. No. 4,000,485. Briefly, a unit wishing to communicate requests a bus cycle and when the bus cycle is granted, the unit becomes the "master" and is able to address any other unit in the system as the "slave". In cases of those bus exchanges which require a response (e.g. memory read operation), the requesting unit as "master" identifies itself and indicates to the "slave" unit that a response is required. When the slave is ready to respond (e.g. obtains the information requested), it assumes the role of "master" and initiates the transfer of information to the requesting unit.

Thus, the number of bus cycles vary depending upon the type of operation being performed. FIG. 6 illustrates the number of bus cycles required for different types of memory operations involving the CPU 40 and one of the subsystems 20 and 30 in addition to the formats of the signals applied to bus 10 by each unit when operating as "master" or "slave". By altering the states of the signals applied to the control lines designated in FIG. 6, a unit is able to designate to the other unit, the type of cycle or operation being initiated or performed.

MEMORY SUBSYSTEM INTERFACE

Figure 2:
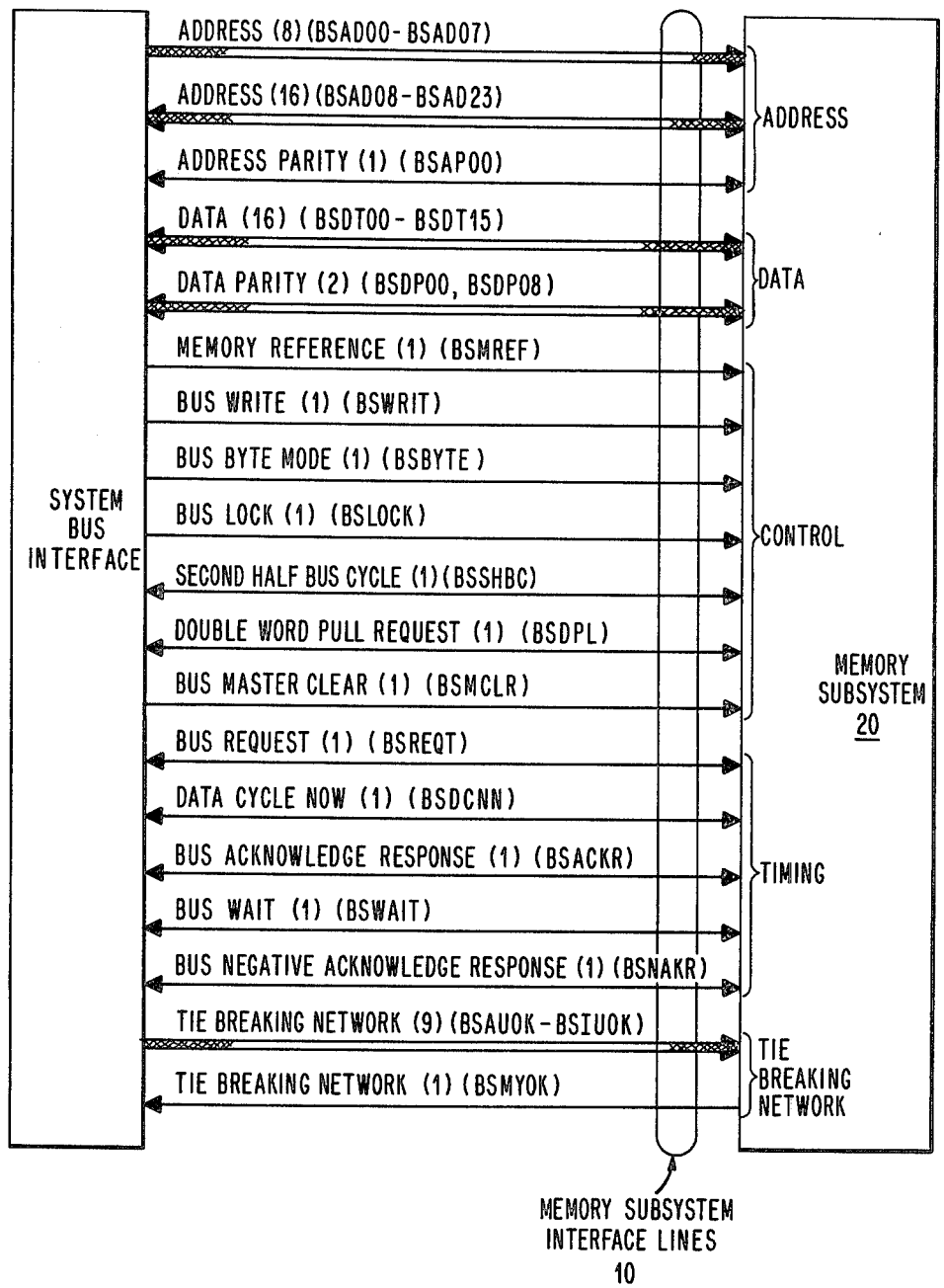
FIG. 2 shows in detail the lines of the system bus 10 which connect to the memory subsystem of FIG. 1.

Before discussing the operations illustrated in FIG. 6, the lines which constitute the interface between each memory subsystem and bus 10 will be discussed with reference to FIG. 2. As seen from FIG. 2, bus 10 includes a number of address lines (BSAD00-23, BSAP00), a number of data lines (BSDT00-15, BSDP00, BSDP08), a number of control lines (BSMREF-BSMCLR), a number of timing lines (BSREQT-BSNAKR) and a number of tie breaking network lines (BSAUOK-BSIUOK, BSMYOK).

The description of the above interface lines are given in greater detail in the section to follow.

MEMORY SUBSYSTEM INTERFACE LINES

| Designation | Description |
|---|---|
| | Address Lines |
| BSAD00-BSAD23 | The bus address lines constitute a twenty-four bit wide path used in conjunction with the bus memory reference line BSMREF to transfer a 24 bit address to subsystem 20 or a sixteen bit identifier from subsystem 20 to bus 10 (for receipt by a slave unit). When used for memory addressing, the signals applied to lines BSAD00-BSAD05 select a particular 128K word module, the signals applied to lines BSAD06-BSAD22 select one of the 128K words in the module while the signal applied to line BSAD23 selects one of the bytes within the selected word (i.e., BSAD23 = 1 = right byte; BSAD23 = 0 = left byte). When used for identification, lines BSAD00-BSAD07 are not used. The lines BSAD08-BSAD23 carry the identification of the receiving unit as transmitted to subsystem 20 during the previous memory read request. |
| BSAP00 | The bus address parity line is a bidirectional line which provides an odd parity signal for the address signals applied to lines BSAD00-BSAD07. |
| | Data Lines |
| BSDT00-BSD15 | The bus data lines constitute a sixteen bit or two byte wide bidirectional path for transferring data or identification information between subsystem 20 and bus 10 as a function of the cycle of operation being performed. During a write cycle of operation, the bus data lines transfer information to be written into memory at the location specified by the address signals applied to lines BSAD00-BSAD23. During the first half of a read cycle of operation, the data lines transfer identification information (channel number) to the subsystem 20. During the second half of the read cycle, the data lines transfer the information read from memory. |
| BSDP00,BSDP08 | The bus data parity lines are two bidirectional lines which provide odd parity signals coded as follows: BSDP00 = odd parity for signals applied to lines BSDT00-BSDT07 (left byte); and BSDP08 = odd parity for signals applied to lines BSDT08-BSDT15 (right byte). |
| | Control Lines |
| BSMREF | The bus memory reference line extends from bus 10 to the memory subsystem 20. When set to a true state, this line signals the subsystem 20 that the lines BSAD00- |

-continued
MEMORY SUBSYSTEM INTERFACE LINES

| Designation | Description |
|---|---|
| | BSAD23 contain a complete memory controller address and that it is performing a write or read operation upon the specified location. When reset to a false state, the line signals subsystem 20 that the lines BSAD00-BSAD23 contain information directed to another unit and not subsystem 20. |
| BSWRIT | The bus write line extends from the bus 10 to the memory subsystem 20. This line when set to a true state, in conjunction with line BSMREF being true, signals subsystem 20 to perform a write cycle of operation. When reset to a false state, this line, in conjunction with line BSMREF being true, signals subsystem 20 to perform a read cycle of operation. |
| BSBYTE | The bus byte line extends from bus 10 to subsystem 20. This line, when set to a true state, signals subsystem 20 that it is to perform a byte operation rather than a word (2 bytes) operation. The specific operation is defined by this line in conjunction with line BSWRIT as follows: (1) When both lines are true, this signals a request for the subsystem 20 to write new data into either the left or right byte position of the specified location in accordance with the state of line BSAD23. (2) When line BSBYTE is true and line BSWRIT is false, this signals a request for subsystem 20 to read out the entire contents (2 bytes) of the specified location and select one of the bytes in accordance with the state of line BSAD23. |
| BSLOCK | The bus lock line extends from bus 10 to subsystem 20. When set to a true state, this line signals subsystem 20 of a request from central processor 40 to test or change the status of a memory lock flip-flop included within the controller 22. |
| BSSHBC | The bus second half bus cycle line is used to signal a unit that the current information applied to bus 10 by subsystem 20 is the information requested by a previous read request. In this case, both subsystem 20 and the unit receiving the information are busy to all units from the start of the initiation cycle until subsystem 20 completes the transfer. This line is used in conjunction with the BSLOCK line to set or reset its memory lock flip-flop. When a unit is requesting to read or write and line BSLOCK is true, the line BSSHBC, when true, signals subsystem 20 to reset its lock flip-flop. when in a false state, it signals subsystem 20 to test and set its lock flip-flop. |
| BSDBPL | The double word pull line is a bidirectional line which extends between bus 10 and subsystem 20. This line, when set to a true state, signals subsystem 20 that a double word operation is requested. |

MEMORY SUBSYSTEM INTERFACE LINES

| Designation | Description |
|---|---|
| | Additionally, the subsystem 20 forces the line to a true state during the data cycle (BSDCNN = 1) to signal the receiving unit that a second word is to follow. When the second location is non-existent, the line is not forced to a true state and only a single word is transferred. |
| BSMCLR | The bus master clear line extends from bus 10 to subsystem 20. When this line is set to a true state, it causes the subsystem 20 to clear to zeros certain bus circuits within controller 200. |
| | Timing Lines |
| BSREQT | The bus request line is a bidirectional line which extends between bus 10 and subsystem 20. When set to a true state, it signals the subsystem 20 that another unit is requesting a bus cycle. When reset to a false state, it signals subsystem 20 that there is no bus pending bus request. This line is forced to a true state by subsystem 20 to request a read second half bus cycle. |
| BSDCNN | The data cycle line is a bidirectional line which extends between bus 10 and subsystem 20. When forced to a true state, the line signals the subsystem 20 that a unit was granted a requested bus cycle and placed information on the bus for another unit. The subsystem 20 forces the line to a true state to signal that it is transmitting requested data back to a unit. Prior to this, subsystem 20 had requested and been granted a bus cycle. |
| BSACKR | The bus acknowledge line is a bidirectional line which extends between the bus 10 and subsystem 20. When set to a binary ONE by subsystem 20, the line signals that it is accepting a bus transfer during a read first half bus cycle or write cycle. During a read second half bus cycle, this line when set to a binary ONE by the unit which originated the request signals the subsystem 20 of its acceptance of a transfer. |
| BSWAIT | The bus wait line is a bidirectional line which extends between bus 10 and subsystem 20. When set to a true or binary ONE state by subsystem 20, it signals a requesting unit that the subsystem cannot accept a transfer at this time. Thereafter, the unit will initiate successive retries until the subsystem 20 acknowledges the transfer. The subsystem 20 sets the BSWAIT line true under the following conditions:<br>1. It is busy performing an internal read or write cycle of operation.<br>2. It is requesting a read second half bus cycle.<br>3. It is anticipating a refresh operation.<br>4. It is performing a refresh operation.<br>5. It is busy when placed in an initialize mode.<br>When the BSWAIT line is set to a true or binary ONE state by a unit, this |
| BSNAKR | signals the subsystem 20 that the data is not being accepted by the requesting unit and to terminate its present bus cycle of operation.<br>The bus negative achknowledge line is a bidirectional line which extends between the bus 10 and subsystem 20. When this line is set to a true or binary ONE state by subsystem 20, it signals that it is refusing a specified transfer. The subsystem 20 sets line BSNAKR to a true state as follows:<br>1. Memory lock flip-flop is set to a binary ONE, and<br>2. The request is to test and set the lock flip-flop (BSLOCK true and BSSHBC false).<br>In all other cases, when the memory lock flip-flop is set, subsystem 20 generates a response via the BSACKR line or the BSWAIT line or generates no response. When the BSNAKR line is forced true by a unit, this signals subsystem 20 that the data is not accepted by the unit and to terminate its cycle of operation. |
| BSAUOK-BSIUOK | The tie breaking network lines extend from bus 10 to subsystem 20. These lines signal subsystem 20 whether units of higher priority have made bus requests. When all the signals on these lines are binary ONES, this signals subsystem 20 that it has been granted a bus cycle at which time it is able to force the BSDCNN line to a binary ONE. When any one of the signals on the lines is a binary ZERO, this signals subsystem 20 that it has not been granted a bus cycle and is inhibited from forcing line BSDCNN to a binary ONE. |
| BSMYOK | The tie breaking network line extends from subsystem 20 to bus 10. Subsystem 20 forces this line to a false or binary ZERO state to signal other units of lower priority of a bus request. |

MEMORY REQUEST FORMATS—FIG. 6

The CPU 40 can generate the different types of memory request shown in FIG. 6. As seen from the Figure, CPU 40 initiates a memory write operation by forcing the BSWRIT and BSMREF lines true and applying address and data to the BSAD and BSDT lines respectively. In the system of FIG. 1, all memory write operations require a single bus cycle and involve the transfer of a single word. Hence, CPU 40 places the BSDPL line in a false or binary ZERO state signaling the memory that it is a single word request.

In the case of memory read operations, CPU 40 can signal if it wants a single word or two sequential words. Reading a single word from memory requires two bus cycles. During the first cycle, the CPU 40 as the master requests the information by forcing the BSMREF line true and applying address and control information to the BSAD and BSDT lines respectively. By forcing the BSWRIT line false, CPU 40 signals the slave unit tht the memory operation requires a response. Also, CPU 40 signals its identity to the slave unit and tags the request as a single fetch request by applying its channel number and a function code of $00_{16}$ to the BSDT lines.

During the second bus cycle designated by the slave forcing line BSSHBC true, the fetched data word is returned to CPU 40 via the BSDT lines. The memory or slave also returns the $00_{16}$ function code to CPU 40 via the BSAD lines together with its address or channel number. This enables the CPU 40 to distinguish between memory requests since there can be both double word fetch and single word fetch memory requests to different memory module units outstanding at the same time.

Reading two sequential words from memory requires three bus cycles when both words are in memory. When making a double fetch request, CPU 40 forces the BSDBPL line true. During the second bus cycle, the memory, as master, forces the BSDBPL line true indicating to the CPU 40 that another word is to follow. During the third bus cycle, the memory delivers the second word as shown in FIG. 6.

The above describes the manner in which a memory subsystem communicates over bus 10 with a CPU in the processing of memory requests. The arrangement of the present invention takes advantage of the communications arrangement in singling out those memory operations involving a single word transfer and performing refresh operations during those cycles in parallel with the memory operation as explained herein.

Figure 3:
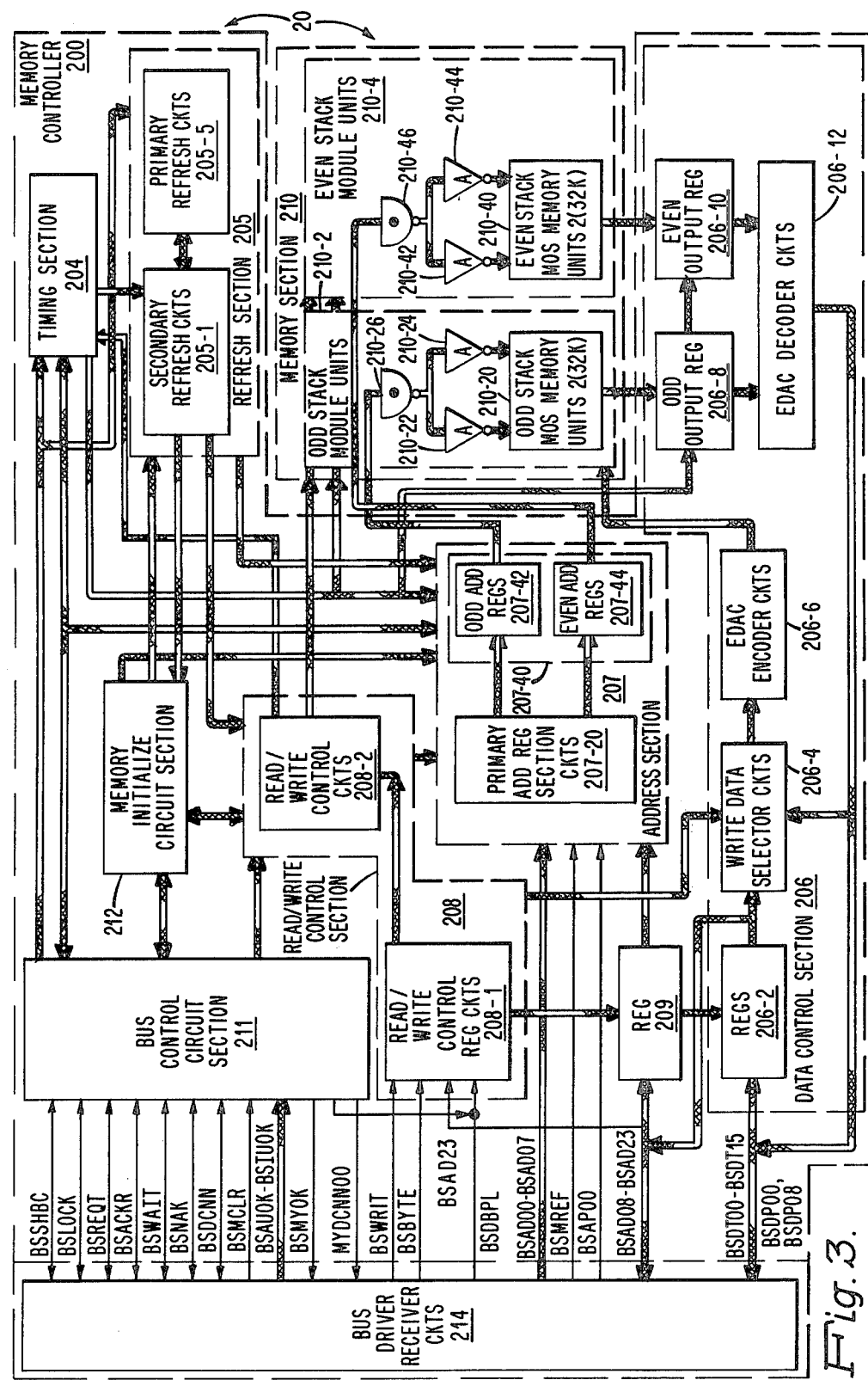
FIG. 3 shows in block diagram form the memory subsystem 20 of FIG. 1.

A preferred embodiment of a memory subsystem which incorporates the apparatus of the present invention is shown in FIG. 3.

Memory Subsystem 20

Referring to FIG. 3, it is seen that subsystem 20 includes a memory controller 200 which controls the four 32K word memory module units 210-2 and 210-4 of memory section 210. As seen from the Figure, module units of blocks 210-2 and 210-4 include high speed MOS random access memory integrated circuits designated by blocks 210-20 and 210-40, and address buffer circuits designated by blocks 210-22 through 210-46. Each 32K memory unit is constructed from 16K word by one bit dynamic MOS RAM arrays, conventional in design. More specifically, each 32K by 22 bit memory module includes forty-four 16,384 word by one bit chips. Within each chip there are a number of storage arrays organized in a matrix of 128 rows by 128 columns of storage cells.

The controller 200 includes those circuits required to generate memory timing signals, perform refresh operations, data transfer operations, address distribution and decoding operations and bus interface operations. Such circuits are included as part of the different sections of FIG. 3.

The sections include a timing section 204, a refresh section 205, a data control section 206, an address section 207, a read/write control section 208, a bus control circuit section 211 and memory initialize circuit section 312.

The bus control section 211 includes the logic circuits which generate signals for generating and accepting bus cycle requests for single and double word operations. As seen from FIG. 3, these circuits as well as the circuits of other sections are connected to bus 10 via driver and receiver circuits, conventional in design. It will be noted that the binary ONE and ZERO states of the signals on bus 10 and those utilized within subsystem 20 differ. The bus signals operate with negative logic while the subsystem 20 utilizes positive logic. The section 211 includes the tie breaking network circuits which resolves request priority on the basis of a unit's physical position for the bus. The memory subsystem 20, located at the left most or bottom position, is assigned the highest priority while the CPU 40, located at the highest most or top position, is assigned the lowest priority. For further information regarding bus operation, reference may be made to the above mentioned U.S. patents and U.S. patent applications.

The timing section 204, shown in detail in FIG. 4b, includes circuits which generate the required sequence of timing signals for memory read and write cycles of operation. As seen from FIG. 3, this section transmits and receives signals to and from sections 205, 207, 208 and 211. The address section 207 includes primary address register circuits 207-1 and second address register circuits 207-2 and 207-3 which decode, generate and distribute address signals required for initialization, read/write selection and refresh operations. The section 207 receives address signals from lines BSAD08-BSAD23 via an input register 209 and address lines BSAD00-BSAD07 and BSAP00 in addition to the memory reference control signal from the BSMREF line. Additionally, section 207 receives control and timing signals from sections 204, 205, 208 and 212.

The memory initialize section 212 includes circuits, conventional in design, for clearing the memory subsystem circuits to an initial or predetermined state. For example, the circuits force read/write control lines to specify a write mode of operation and the BSWAIT line to specify a wait condition preventing units from accessing memory. Address register circuits of section 207 are incremented through consecutive memory cycles of operation during which ZEROS are written into all of the 128K word locations of memory along with good parity.

The read/write control section 208 includes register circuits 208-1 and control logic circuits 208-2. The register circuits 208-1 receive and store signals corresponding to the states of the BSWRIT, BSBYTE and BSDBPL control lines aand the address line BSAD23. The circuits 208-2 decode the signals from circuits 208-1 and generate signals applied to sections 204, 207 and 210 for establishing whether the subsystem is to perform a read, write or a read followed by a write cycle of operation (i.e., for a byte command).

In accordance with the present invention, the refresh section 205 includes the circuits 205-1 for refreshing the contents of memory locations in parallel with normal single word access read or write cycles of operation. The refresh section 205 also includes conventional refresh cicuits 205-2 for periodically refreshing the contents of memory by substituting a refresh cycle of operation in place of a memory cycle of operation. In accordance with the present invention, the circuits 205-2 are only utilized when due to the types of memory operations being performed, refreshing cannot be carried out by the circuits 205-1 within a required period of time as explained herein. As seen from FIG. 3, the refresh section 205 receives timing and control signals from sections 204 and 212 and provides signals to sections 207, 208 and 212.

The data control section 206 includes the registers 206-2, 206-8 and 206-10 and multiplexer circuits 206-4 with associated control circuits which enable data to be written into and/or read from the odd and even memory units 210-20 and 210-40 of section 210. For example, during a double word fetch read cycle of operation, operand or instruction signals are read out from the units 210-20 aand 210-40 into the odd and even output registers 206-8 and 206-10. During a write cycle of operation, operand signals are loaded into the pair of registers of block 206-2 from bus 10 and written into the odd or even unit of section 210.

The subsystem 20 includes an error detection and correction option (EDAC) wherein each word contains 16 data bits and 6 check bits used to detect and correct single bit errors in the data words and detect and signal without correction, double bit errors in the data word.

The EDAC option includes the EDAC encoder circuits 206-6 and EDAC decoder circuits 206-12. These circuits may take the form of those circuits disclosed in U.S. Pat. No. 4,072,853 which issued Feb. 7, 1978.

Additionally, the section 206 enables the return of identification information received from the data lines BSDT0-15 and stored in register 206-2 via the address lines BSAD08-23.

Pertinent portions of the above sections will now be discussed in greater detail with reference to FIGS. 4a through 4d.

DETAILED DESCRIPTION OF CONTROLLER SECTIONS

FIG. 4a illustrates in greater detail, the timing circuits of section 204. Referring to the Figure, it is seen that the section includes a group of timing generation circuits 204-1, a group of steering logic circuits 204-3, a group of row/column address timing circuits 204-5 and timing control circuits 204-7.

The timing generator circuits 204-1 generate via a pair of series connected 200 nanosecond delay lines 204-12 and 204-14 a series of timing pulses which establish the timing for the remaining sections during a memory cycle of operation. The generator circuits initiate a series of timing pulses in response to the signal MYACKR10 being switched to a binary ONE via the bus circuits 111 indicating the memory subsystem's acceptance of a bus cycle request or when signal REFCOM10 is forced to a binary ONE indicating the start of a refresh cycle. This causes a four input AND/OR gate and driver circuit 204-10 to switch signal DLYINN10 from a binary ZERO to a binary ONE. This produces a positive going pulse signal across a 100 ohm termination resistor 204-20 which is propagated through the delay lines 204-12 and 204-14. The input signal DLYINN10 is applied via a pair of series connected inverter circuits 204-11 and 204-13 to back to the input of circuit 204-10 via another AND gate to latch or hold signal DLYINN10 in a binary ONE state. The circuit remains latched long as a signal DLYWO100 applied via an inverter circuit 204-15 remains a binary ONE.

After an interval of 200 nanoseconds, signal DLYWO100 switches to a binary ZERO causing signal DLYINN10 to be returned to a binary ZERO state. However, the positive going pulse signal continues propagation through delay line 204-14.

The tap terminals B through Z of both delay lines 204-12 and 204-14 provide fixed delays in increments of 20 nanoseconds. The pulse signals at these taps generated during a cycle of operation are distributed through jumpers to the various memory sections.

There are certain types of memory operations such as byte write and initialize operations which require additional sequences of timing pulses. In these types of memory operations, more than one pass or cycle through the delay lines 204-12 and 204-14 are completed. For example, in the case of byte write and initialize operations, signal PARTWT10 is forced to a binary ONE in response to a signal PARTSS00 generated by the circuits of block 204-7. It remains a binary ONE until the end of the first pass or cycle at which time signals DL2CYC10 and DL2CYC00, applied via inverter circuits 204-19 and 204-18 respectively, condition the AND gate associated therewith to again switch signal DLYINN10 to a binary ONE. This causes another set of timing signals identical to the first set to be generated.

For a byte write operation, only two passes or cycles are required, the first cycle to perform a read operation and the second cycle to perform a write operation. In the case of an initialize operation, another or second cycle is required for writing binary ZEROS into each location of memory after each refresh cycle (i.e., signal REFCOM10 causes signal PARTSS00 to force signal PARTWT10 to a binary ONE).

In accordance with the preferred embodiment, two sets of clocking signals are required for completing a double word fetch memory cycle of operation. That is, when subsystem 20 is required to supply a requesting unit with a pair of words in response to a double word fetch read request, memory cycles of operation are initiated within the two independent groups of stack module units 210-2 and 210-4. However, the memory cycles are slightly out of phase from one another due to the time required to generate the address of the second word of the pair following the requesting unit's acknowledgement of receipt of the first word of the pair.

Thus, once the timing generator circuits 204-1 begin a cycle of operation, they generate timing signals which cause the circuits 204-5 of FIG. 4a to produce two sets of clocking signals referred to as a normal set (i.e., signals MRASSN10 and MCASSN10) and a late set (i.e., signals MRASSL10 and MCASSL10). As seen from FIG. 4a, these signals are generated by the inverter circuits 204-52 through 204-58 and the AND circuits 204-60 through 204-66 which invert and combine timing signals TTAP1210, TTAP0410 and TTAP0310, as shown. Additionally, the circuits 204-5 include an AND gate 204-50 which generates an acknowledge signal MYACKD10 which is applied to the circuits 204-7.

The two sets of clocking signals are applied to a steering network 204-3 which includes the NAND circuits 204-30 through 204-43 arranged as shown. These circuits establish which circuits associated with the two independent stack module units 210-2 and 210-4 are to receive the normal set of clocking signals and late set of clocking signals as a function of the state of signal MLADX210. The signal MLADX210 is provided by the address register circuits of section 207 and serves as an odd/even address identifier bit.

When signal MLADX210 is a binary ZERO, indicative of an even address location, the circuits 204-3 direct the normal set of clocking signals to the circuits associated with the even stack module units 210-4 (i.e., address and data circuits) and the late set of clocking signals to the circuits associated with the odd stack module units 210-2. However, when signal MLADX210 is a binary ONE, indicative of an odd address location, the circuits 204-3 direct the normal set of clocking signals to the circuits associated with the odd stack module units 210-2 and the late set of clocking signals to the circuits associated with the even stack module units 210-4.

It will also be noted that the signals DFETCH210 and DFETCH010 are applied as inputs to the steering circuits 204-3 from the circuits 208. These signals enable the gating of the late set of clocking signals during double word fetch memory cycles. More specifically, the signals DFETCH010 and DFETCH210 condition NAND gates 204-36 through 204-39 to gate signals MRASSL10 and MCASSL10 during double word fetch memory cycles. Signal DFETCH210 is forced to a binary ONE during those refresh cycles which can be done in parallel with a particular memory cycle, permitting gating of signal MRASSL10 as explained later herein.

As seen from FIG. 4a, the resulting steering circuit signals MCASOD10 and MCASEV10 are specifically applied as inputs to the address circuits of section 207 which address the odd and even stack module units. The signals MRASTO10 and MRASTE10 are applied via the circuits 204-7 to the odd and even output registers 206-8 and 206-10 of section 206.

As seen from FIG. 4a, section 204 further includes the circuits 204-7 portions of which were referred to above. These circuits include the AND gates 204-71 through 204-73, the NAND gate 204-70 and D type flip-flop 204-74 connected as shown. These circuits generate the PARTWT00 and PARTWT10 control signals applied as inputs to the timing generator circuits 204-1 and to the read/write control section 208.

The signal PARTWT10 is also applied as an input to a group of memory busy circuits which include AND gates 204-76 and 204-77, D type flip-flop 204-78, a NOR gate 204-78 and an inverter circuit 204-80. The memory busy signals MEMBUZ10 is forced to a binary ONE whenever the timing generator circuits 204-1 starts a cycle of operation (i.e., when signal MYACKR10 is a binary ONE). It remains a binary ONE as a function of signal MEMBUZTE10.

However, it will be noted that there are three additional signals (i.e., signals MRASSN10, DBCYCE00 and DWDEND10) which influence the state of signal MEMBUZ10. The first signal MRASSN10 when switched to a binary ONE, maintains signal MEMBUZ10 at a binary ONE during the time interval between when signal MYACKR10 switches to a binary ZERO and signal MEMBUZTE10 switches to a binary ONE. The second signal DBCYCE00 is switched to a binary ONE during a write byte or memory initialize operation and maintains signal MEMBUZ10 at a binary ONE during the time interval between when signal MEMBUZTE10 switches to a binary ZERO at the end of a first pass or cycle through delay lines 204-12 and 204-14 and signal MRASSN10 switches to a binary ONE during the second cycle through the delay lines 204-12 and 204-14. The third signal DWDEND10 is switched to a binary ONE during double word fetch cycles of operation and maintains signal MEMBUZ10 at a binary ONE during the time interval between first and second MYDCNN10 signals. As seen from FIG. 4a, these signals are generated by the circuits 211 which are disclosed in detail in the previously cited patent and related patent applications.

As seen from FIG. 4a, the circuits 204-7 further include a pair of inverter circuits 204-81 and 204-82 used to distribute timing signals to sections 207 and 208. It also includes a D type flip-flop 204-84 and a pair of AND gates 204-85 and 204-86 arranged as shown. These circuits generate the clocking signals MDOECT10 and MDOOCT10 which are applied the even and odd data registers 206-10 and 206-8 respectively for clocking data read out from the even and odd stack module units 210-4 and 210-2.

Lastly, the section 204-7 further includes two sets of series connected AND gate and delay circuits for generating clocking signals MCAST010 and MCASTE10. These signals along with clocking signals MRAST010 and MRASTE10 are applied to the clock input terminals of corresponding ones of RAM chips of the even and odd stack units 210-20 and 210-40.

The delay circuits 204-91 and 204-94 provide delays of 20 nanoseconds sufficient to ensure that the clocking signals MCASTO10 and MCASTE10 arrive at a time following the arrival of the multiplexed or switched address signals from the circuits 207-42 and 204-44 (i.e., compensate for the delays through the address registers and address buffer circuits included with the stacks). The clocking signals MCASTO10 and MCASTE10 clock or gate the output address signals from circuits 207-42 and 207-44 into the stack units 210-20 and 210-40.

Refresh Section 205

FIG. 4b shows in greater detail the refresh circuits of the preferred embodiment of the present invention. As mentioned above, a requirement of all dynamic MOS memory subsystems is the inclusion of circuits dedicated to performing refresh operations on the MOS memory cells. Generally, such circuits determine the frequency of refresh cycles by interrupting memory operations and synchronize the refresh cycles with memory requests so as not to cause interference. Additionally, such circuits determine what memory location to refresh and in some cases provide substrate bias voltages for such chips.

Circuits 205-1

In the preferred embodiment, such refresh circuits are organized into two types. The first type corresponds to circuits 205-1 which operate in the general manner just described. More specifically, the circuits 205-1 include a pair of oscillator circuits comprising circuits 205-10 through 205-21, an address counter 205-33 and control circuits 205-22 through 205-32. The circuits 205-1 operate to refresh each dynamic MOS memory cell at a minimum rate of 2 milliseconds without destroying memory data by interrupting normal memory activity. In the case of a 16K MOS chip, 128 cycles are required to refresh all of the cells of the entire chip.

The circuits 205-1 operate to substitute refresh cycles for bus cycles to ensure all 128 columns of the chip are selected within a 2 millisecond interval. That is, refresh cycles are evenly distributed throughout the 2 millisecond interval. Therefore, a refresh cycle occurs approximately every 15 microseconds. During each such refresh cycle, the memory subsystem 20 is placed in an internal read mode of operation, all memory clock decoding signals are overridden and the same column out of 128 columns in every 16K MOS chip of each module is refreshed.

Considering the above in greater detail, the refresh oscillator circuit including a resettable one shot circuit 205-10 is a self starting oscillator circuit that operates at a pulse repetition rate of 15±1 microseconds. When power is applied, the $\overline{Q}$ output side signal CORREF00 is forced to a binary ONE. This causes signal CORREF20 to be switched to a binary ONE and this signal is fed back to the T input of the circuit via OR gate 205-12. This signal triggers the circuit 205-10 switching the Q output side signal CORREF10 to a binary ONE and the signal CORREF000 to a binary ZERO. At the end of a 15 microsecond interval established by the values of the elements 205-15 and 205-16, the circuit 205-10 again switches signal CORREF00 to a binary ONE resulting in its retriggering. An indication of the positive or binary ONE change of state in signal CORREF00 is stored in an early refresh indication flip-flop 205-28 when the signal INHREF20 generated by the primary refresh circuits 205-58 is a binary ONE (i.e., refresh is not inhibited). The complement side of flip-flop 205-28 applies a REREQA00 signal as an input to the bus wait circuits of block 211. The assertion side of flip-flop 205-28, REREQA10 is applied to the D input of flip-flop 205-29.

The second resettable one shot circuit 205-11 (fine refresh) is also triggered by the signal CORREF20 applied via OR gate 205-14. At this time, circuit 205-11 switches the Q output side signal FINREF10 to a binary ONE. At the end of a 150 nanosecond interval established by the values of elements 205-17 and 205-18, the circuit 205-11 switches signal FINREF10 to a binary ZERO. The signal FINREF10 is inverted by a NAND gate 205-21 and the trailing edge of the signal switches a refresh request flip-flop 205-29 to a binary ONE. Thus, the signal REREQB10 is set to a binary ONE, 150 nanoseconds after signal REREQA00 switches to a binary ONE to prevent a conflict with asynchronous bus cycle requests which occur at the same time an early refresh request is generated.

The signal REREQB10 is applied via an AND gate 205-30 to the clock input terminal of a refresh command flip-flop 205-31. When the memory busy signal MEMBUZ10 is a binary ZERO indicating that the memory subsystem 20 is not executing a memory cycle and the subsystem is not in a battery save mode (signal PW5ASD00 is a binary ONE), AND gate 205-27 forces signal REFBUZ00 to a binary ONE enabling flip-flop 205-31 to switch a binary ONE state in response to signal REREQB10 being switched to a binary ONE. However, when signal MEMBUZ10 is a binary ONE indicating the memory subsystem is busy, the refresh command flip-flop 205-31 is not switched to a binary ONE until the completion of the memory cycle indicated by signal MEMBUZ10 being switched to a binary ZERO.

The signals REFCOM10 and REFCOM00 are applied as inputs to write control section 208 for placing the memory subsystem in a read mode and to timing action 204 for inhibiting and enabling respectively the generation of signals MCASSN10 and MRASSN10. Also, signal REFCOM00 is applied as an input to section 207 for loading the contents of counter 205-33 into the even and odd address registers of block 207-2 and 207-3.

Except for the above actions, the same sequence of timing signals are generated as those in the case of a normal memory cycle of operation. At the end of the cycle, the NAND gate 205-24 generates a pulse signal REFRES00 by continuing signals DLY22010 and DLY40010 from section 204. This signal is applied to the clear terminals of the refresh flip-flops 205-28, 205-29 and 205-31 for clearing them to binary ZERO states in preparation of a subsequent refresh cycle of operation.

Circuits 205-2

The second type of refresh circuits operate in a fashion which is transparent or hidden to the performance of memory cycles of operation. These circuits are operated to take advantage of different sets of circuits which enable the independent operation of module units 210-2 and 210-4 as explained herein.

In accordance with the preferred embodiment, the circuits 205-5 include a plurality of D type flip-flops 205-62 through 205-66 in addition to gate and inverter circuits 205-50 through 205-60 connected as shown.

When signal FINREF00 is a binary ONE and signal MYACKR10 switches to a binary ONE, the flip-flop 205-62 switches signal LFNREF10 to a binary ZERO as a consequence of the D and clear input terminals being at a binary ZERO (low) and a binary ONE (high) respectively. Signal LFNREF10 causes NAND gate 205-55 to force signal GFNREF00 to a binary ONE. This enables flip-flop 205-63 to be set to a binary ONE in response to a single word request (i.e., when signal SWPCLK10 is a binary ONE) specifying one of the odd stack module units (i.e., when signal MLADX210 is a binary ONE). To reduce the number of circuits, a specific group of the stack module units was selected. Obviously, either group could have been selected.

When a binary ZERO, signal LK2SWP00 inhibits the flip-flop 205-63 from any further switching. When forced to a binary ONE, by a positive going edge at the clock input and a binary ONE at the D input from signal MLADX210, signal LK2SWP10 causes the first single word pull history flip-flop 205-65 to switch to a binary ONE. Signal SWPHIS100 when forced to a binary ZERO, causes NAND gate 205-59 to force the D fetch override signal DFCHOR10 to a binary ZERO. The signal DFCHOR00 and DFCHOR10 are applied to the circuits 208 causing them to specify a read cycle of operation and to force signal DFETCH210 to a binary ONE discussed herein. As seen from FIG. 4d, signal SWPHIS100 is also applied as an input to section 207. Signal SWPHIS100 signifies a hidden refresh operation on the even stack.

The second single word pull history flip-flop 205-64 is switched to a binary ONE via AND gate 205-56 when signals LK2SWP10 and MLADX200 are both binary ONES in response to signal SWPCLK10 being switched to a binary ONE. When signal SWPHIS210 switches to a binary ONE, it enables the inhibit refresh flip-flop 205-66 to be switched to a binary ONE at the trailing edge of signal MYACKD10 (i.e., when signal SWPCLK00 switches to a binary ONE). Signal INHREF10 is inverted by NAND gate 205-58 and applied to the early refresh request and refresh request flip-flop 205-28 for inhibiting the setting thereof. The signal INHREF00 is applied to AND gate 205-54 to inhibit any further switching of flip-flops 205-63 and 205-64 in response to signals MYACKD10 and DFETCH000.

Both flip-flops 205-64 and 205-65 are reset to binary ZEROS via pulse signal RRESET00 which is applied to the clear terminals of each flip-flop at the end of a memory cycle of operation. At this time, signal SWPHIS200 applied to AND gate 205-32 causes the contents of counter 205-33 to be incremented by one when the flip-flops 205-64 switch from a binary ONE to a binary ZERO state in response to pulse signal RRESET00.

Address Section 207

FIG. 4d shows in greater detail, the different sections of address section 207. As shown, section 207 includes an address configuration section 207-10, a primary address register section 207-20, a secondary address register section 207-40 and address decoder section 207-60. Twenty-three of the 24 address signals BSAD0010 through BSAD2210 and parity signals BSAP0010 are applied via receiver circuits as inputs to section 207. The signals BSAD0010 through BSAD0410 are applied to address comparison circuits, conventional in design, included within block 207-11 for comparison with signals generated by static module select switches, not shown. Also, the module select signal BSADX010 generated by switch network 207-12, in response to signal BSAD0510, is applied as an input to the address comparison circuits of block 207-11.

The circuits of block 207-11 generate signal MYADG000 for indicating proper module identification. This signal is in turn applied to bus control circuit section 211 to condition the circuits therein for subsequent acceptance of a memory request. Other circuits within block 207-11 generate a parity error signal MODPAR00 in response to signals BSAP0010, BSAD0010 through BSAD0710.

As seen from FIG. 4d, the signals BSADX010 through BSADX710 are applied as inputs to different ones of the five 4-bit registers/counters 207-22 through 207-26 of primary address section 207-20. Each of the registers 207-22 through 207-26 are loaded in parallel with the address signals being indicated in response to address strobe signal ADDSTR00 forced to a binary ZERO. Signal ADDSTR00 is forced to a binary ZERO when signal MEMBUZ00 switches to a binary ONE.

Additionally, NAND gates 207-27, 207-28 and 207-29 together with an inverter circuit 207-30 are connected to the increment input terminals of the registers 207-22 through 207-26 for incrementing the contents thereof upon command. That is, when the memory subsystem 20 is to perform a double word fetch command (i.e., signal DFETCH000 is a binary ZERO), these circuits generate the increment pulse signal MADRUC00 which increments by one the bus address contents of counters 207-22 through 207-26. The NAND gate 207-29 receives signals MADRX210 through MADR1110 together with increment pulse signal MADRUC10 and generates an increment pulse signal MADRC300 for the last two counters 207-25 and 207-26 whenever the registers 207-22 through 207-25 store an all ONES count.

Additionally, the registers 207-22 through 207-26 operate as counters whenever the memory subsystem 20 is placed in an initialize mode (i.e., signal REFINI10 is pulsed to a binary ZERO) wherein the registers 207-22 through 207-26 are cycled through the different combinations of address signals and ZEROS are written into the corresponding memory locations.

As seen from FIG. 4d, section 207-20 further includes a register counter 207-31 for storing another indication of the state of signal BSADX210. This signal produces odd/even address bit signal MLADX210. This signal together with signal MLADX200 is applied as inputs to sections 205 and 208. The signals MLADX200 and MLADX210 are applied as inputs to address decode section 207-60. It will be noted that the state of signal BSADX210 is sampled and stored in response to signal ADDSTR00.

The contents of register 207-31 are incremented only in response to signal REFINI10 during the initialize mode of operation. Accordingly, the odd/even address bit contents (i.e., signal MLADX210) remains unchanged during refresh and double word pull memory cycles of operation.

The secondary address register section 207-40 includes two independent sets of secondary address register circuits 207-42 and 207-44. Each set includes three registers (i.e., 207-400, 207-402 and 207-404 and 207-440, 207-442 and 207-444) constructed from D type transparent latch circuits such as those designated SN74S373 and manufactured by Texas Instruments Incorporated. The circuits are transparent meaning that while the G input terminal is a binary ONE, the signals at the Q output terminals follow the signals applied to the D input terminals.

One of the registers of each set (i.e., 207-400 and 207-440) store those address signals which correspond to a row address while another one of the registers (i.e., 207-402 and 207-442) store those address signals which correspond to a column address. The last one of the registers of each set (i.e., 207-404 and 207-444) store address signals from section 205 which correspond to a refresh address. As seen from FIG. 4d, the different address output terminals of the registers of each set are connected in common in a wired OR arrangement for enabling the multiplexing of these address signals. Such multiplexing is accomplished by controlling the state of the signals applied to the output control (OC) input terminals of the sets of registers.

More specifically, the output control (OC) terminals enable so-called tristate operation and are controlled by the inverter, AND and NAND gate circuits 207-46 through 207-56. The states of signals MCASEV10 and MCASOD10 in turn control the states of the two sets of signals ORASCT00, OCASCT00, OREFCT00 and ERASCT00, ECASCT00, EREFCT00. When each of these signals is in a binary ONE state, this inhibits any address signal from being applied at the Q output terminals of that register. However, this operation is independent of the latching action of the register flip-flops.

Considering the latching action briefly, the row address signals and the column address signals are latched differently depending upon the type of memory cycle of operation. In the case of single word pull or fetch cycles, the secondary row and column address registers are latched at the time the primary address registers are latched (i.e., when signal MEMBUZ10 switches to a binary ONE). The address signals remain latched until the end of the memory cycle of operation.

In the case of double word pull or fetch cycles, the contents of the primary address registers corresponding to the bus address signals are applied to the sets of secondary row and column address registers. Depending upon the state of signal MLADX210, one of the sets of registers latches and holds the input address signals. Next, the primary address register contents are incremented and held until the end of the cycle. The incremented contents are then passed on to the other set of registers whose latching control is held open so that the D input signals are passed on to the Q outputs. Latching of the late set of secondary registers is unnecessary because the primary registers will hold the incremented value to the end of the cycle.

The refresh address register of each set of registers is not required to be latched since the input refresh address signals are obtained from counter 205-33 of section 205 which holds the same address value throughout the memory cycle of operation.

The address decode section 207-60 as seen from FIG. 4d includes two sets of a first plurality of series connected NAND gates 207-62 through 207-68, a pair of registers 207-72, 207-74, a pair of inverter circuits 207-69, 207-70, a pair of decoder circuits 207-76, 207-78 and two sets of a second plurality of NAND gates 207-80 through 207-87. The series connected NAND gates 207-62, 207-65 and 207-67 operate to generate address strobe signal ADDSTE10 in accordance with the state of odd-even address signal MLADX210. Similarly, the series connected NAND gates 207-64, 207-66 and 207-68 operate to generate address strobe signal ADDST010.

The registers 207-72 and 207-74 operate in a manner similar to the row and column address registers of section 207-40. That is, during double word pull or fetch cycles, one of the registers 207-72, 207-74 stores a first set of address signals received from the primary register section 207-20. The contents of the primary address registers are incremented and held in the other one of the registers 207-72, 207-74. The set of output signals MADEX110, MADEX310 and MADOX110, MADOX310 are applied to the 2 to 4 decoder circuit 207-76 and 207-78. Each of the decoder circuits 207-76 and 207-78 forces one of its output terminals to a binary ZERO forcing one of the four decode signals to a binary ONE. The sets of decode signals DRASE010 through DRASE310 and DRASO010 through DRASO310 are used to gate or apply clocking signal MRASTE10 or MRASTO10 to one of four rows of memory locations of each of the stack memory units 210-20 and 210-40. During a refresh cycle of operation, one set of the decode signals is overridden by signal EREFCT00 or OREFCT00 forcing them to binary ONES. This gates or applies the clocking signal MRASTE10 or MRASTO10 to all four rows of memory locations.

Read/Write Control Section 208

Figure 4C:
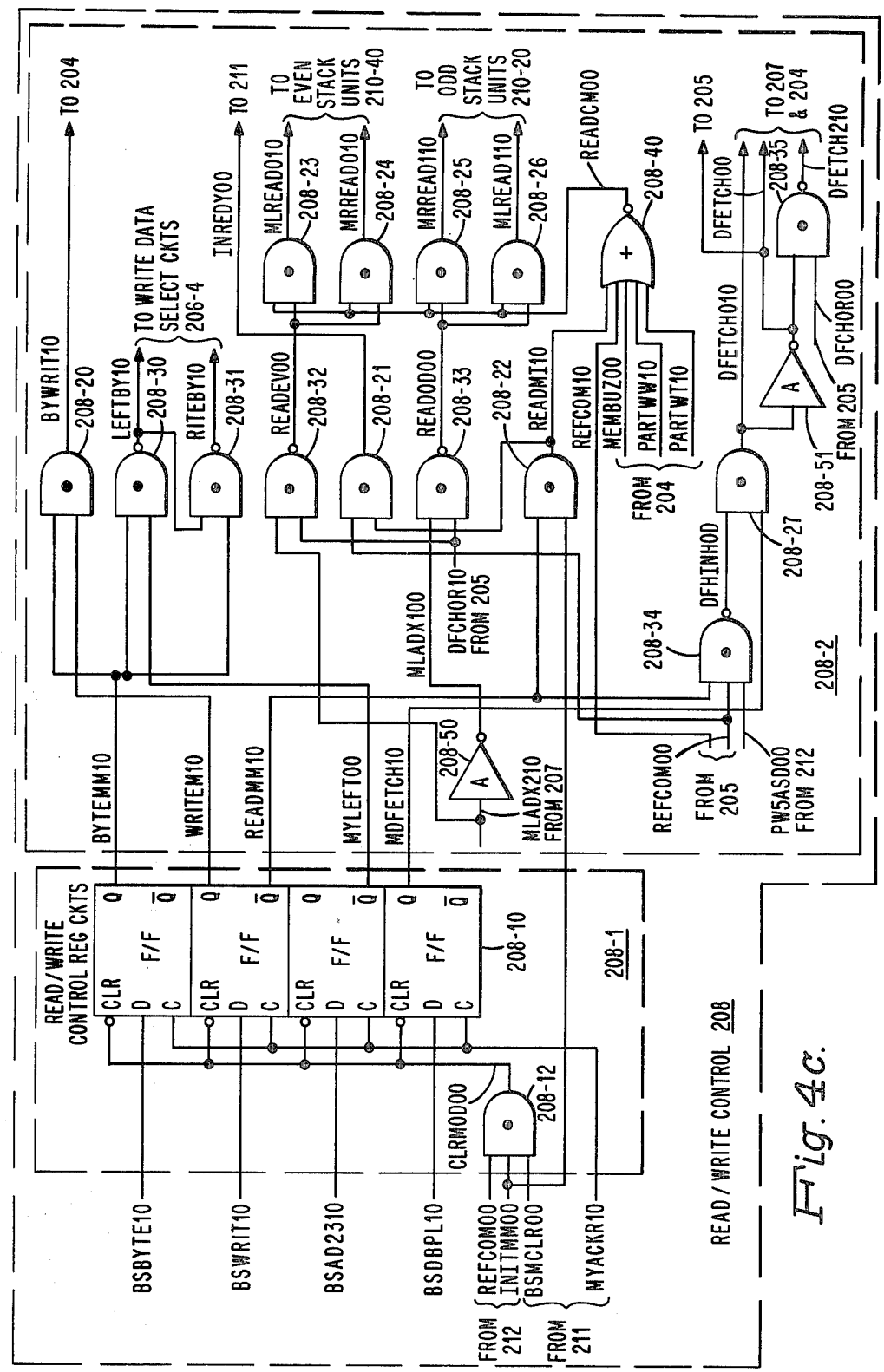

The section 208 is shown in greater detail in FIG. 4c. As mentioned, the section 208 includes the register circuits 208-1 and control circuits 208-2. The register circuits 208-1 include a four D type flip-flop register 208-10 for storing signals BSWRIT10 and BSBYTE10 representative of read, write and byte commands. Also, the register 208-10 stores signals BSDBPL10 and DSAD2310 representative of a double word pull or fetch type command and address bit 23. These signals are latched when signal MYACKR10 from section 211 switches to a binary ONE. When any one of the signals REFCOM00, INITMM00 or BSMCLR00 switches to a binary ZERO, an AND gate 208-12 forces signal CLRMOD00 to a binary ONE which clears register 208-10 to a binary ZERO state.

The byte mode signal BYTEMM10, the write mode signal WRITEM10, the read mode signal READMM10, left byte select signal MYLEFT00 and double fetch signal MDFETCH10 are applied to different ones of the gates which comprise the circuits 208-2. The circuits 208-2 include a number of AND gates 208-20 through 208-27, a number of NAND gates 208-30 through 208-35, a NOR circuit 208-40 and a pair of inverter circuits 208-50 and 208-51.

The AND gate 208-20 generates the byte write signal BYWRIT10 applied to section 204 which forces signal PARTWT10 to a binary ONE. This, in turn, causes NOR gate 208-40 to force read command signal READCM00 to a binary ZERO. The AND gates 208-23 through 208-26 force signals MLREAD010 through MLREAD110 to binary ZEROS. These signals are applied to the read/write control lines of the even and odd stack units 210-20 and 210-40. However, the signals are inverted by circuits (not shown) included within units 210-2 and 210-4 before being applied to the stack memory units 210-20 and 210-40. These signals specify a read mode of operation to initiate a read cycle of operation prior to initiating the write cycle of operation required for the execution of each byte write command.

In the case of a write operation in the word mode, signal WRITEM10 is a binary ONE while signal BYTEMM10 is a binary ZERO. The result is that since signal BYWRIT10 is a binary ZERO, the read command signal READCM00 is a binary ONE. When signal DFCHOR10 is a binary ZERO indicating no refresh operation being done in parallel, each of the NAND ges 208-32 and 208-33 is enabled to force signal READEV00 or signal READOD00 to a state for specifying the write operation. Hence, one set of signals MLREAD010, MRREAD010, or MRREAD110, MLREAD110, is forced to binary ONES to initiate the write cycle of operation.

The series connected NAND gates 208-30 and 208-31 generate the left and right select signals LEFTBY10 and RITEBY10 which are applied to the multiplexer selector circuits 206-4. When byte mode signal BYTEMM10 is a binary ZERO, the NAND gates 208-30 and 208-31 force signals LEFTBY10 and RITEBY10 to binary ONES. This enables a word of data to be applied as an input to memory section 210. When byte mode signal BYTEMM10 is a binary ONE, the state of left byte signal MYLEFT00 defined by signal BSAD2310 causes one of the NAND gates 208-30 and 208-31 to force its output to a binary ONE (i.e., when signal BSAD2310 is a ONE, signal LEFTBY10 is ZERO while signal RITEBY10 is a ONE).

In the case of a word read mode of operation, signals BYTEMM10 and WRITEM10 are binary ZEROS while signal READMM10 is a binary ONE. This causes AND gate 208-22 to force signal READMI10 to a binary ONE. In response thereto, NOR gate 208-40 forces the read command signal READCM00 to a binary ZERO which in turn forces signals MLREAD010 through MLREAD110 to binary ZEROS. Also, during a refresh cycle or when the memory is not busy (i.e., when signal REFCOM10 or signal MEMBUZ00 is a binary ONE), the NOR gate 208-40 forces signal READCM00 to a binary ZERO forcing the signals MLREAD010 through MLREAD110 to binary ZEROS so as to specify a read mode of operation.

It will be noted that the signal DFCHOR10, discussed above, serves as an input to both the NAND gates 208-32 and 208-33 to reduce the number of interconnecting signal. It will be appreciated that the signals SWPHIS01 and SWPHIS02 could have been utilized in place of signal DFCHOR10. However, the result is the same. That is, signal DFCHOR10 is forced to a binary ONE indicating that a refresh operation is to be done in parallel with a memory access (transparent or hidden). This causes one of the NAND gates 208-32 and 208-33 corresponding to the stack memory units not being accessed, to force its output signal to a binary ZERO. The set of read/write signals corresponding thereto are, in turn, forced to binary ZEROS for specifying a read mode of operation for the stack units associated therewith.

The AND gate 208-21 operates to force an inhibit ready signal INREDY00 to a binary ONE only for actual read cycles of operation (i.e., when signals READMI10 and REFCOM00 are both binary ONES). The signal INREDY00 is applied to the bus control circuit section 211 for conditioning the circuits to obtain access to bus 10. Accordingly, during refresh cycles (i.e., REFCOM00=0), write cycles (i.e., READMM10=0), or initialize cycles (i.e., INITMM00=0), the AND gate 208-21 forces signal INREDY00 to a binary ZERO. This, in turn, inhibits the memory subsystem 20 from accessing bus 10.

The series connected gates 208-27, 208-34 and 208-35 operate to generate the double word pull/fetch signals DFETCH000, DFETCH010 and DFETCH210. The NAND gate 208-34 forces signal DFHINH00 to a binary ONE during a refresh cycle (i.e., REFCOM00=0), a special power down mode (i.e., PW5ASD00=0) or a write cycle (i.e., READMM10=0). This inhibits AND gate 208-27 from forcing signal DFETCH010 to a binary ONE indicative of a double word pull cycle of operation.

DESCRIPTION OF OPERATION

With reference to FIGS. 1–6, the operation of the preferred embodiment of the present invention will now be described with particular reference to the timing diagrams of FIGS. 5a through 5c. It will be assumed for ease of explanation that each of the units 210-2 and 210-4 include a single 32K stack memory unit. It will be obvious that each of the units 210-2 and 210-4 can include any number of stack units with the provision that both of the units 210-2 and 210-4 include the same number of stack units.

Figure 5A:
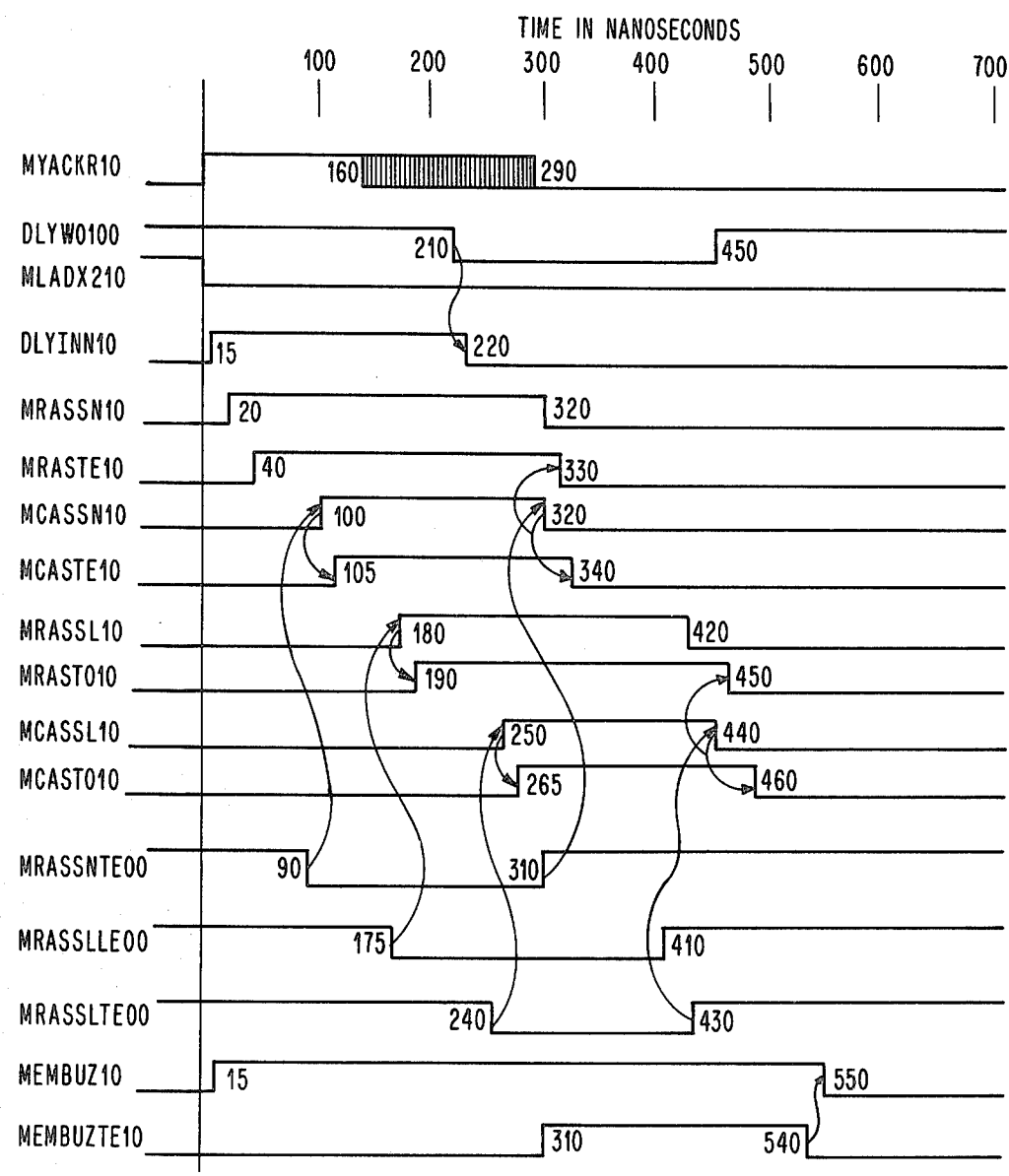
FIGS. 5a through 5c are timing diagrams used in describing the operation of the present invention.
Figure 5B:
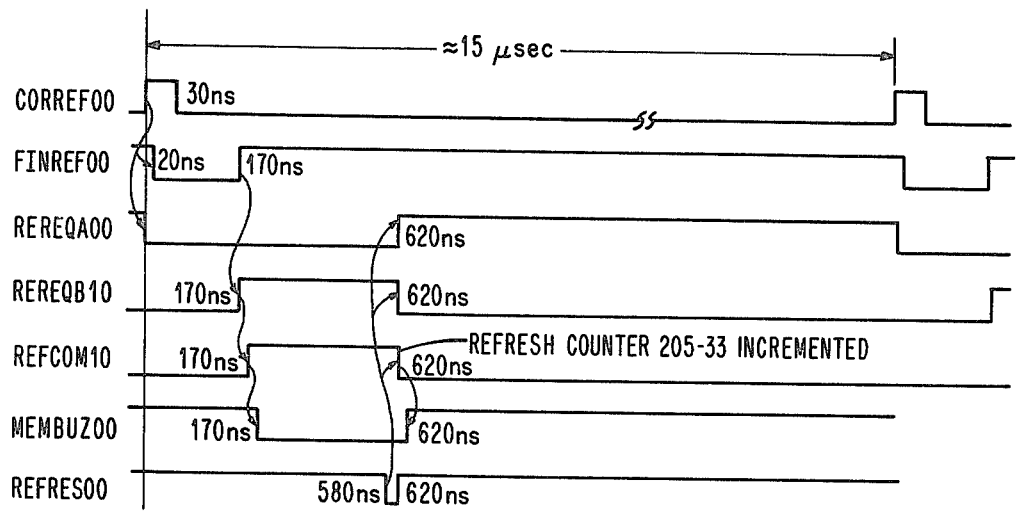
Figure 5C:
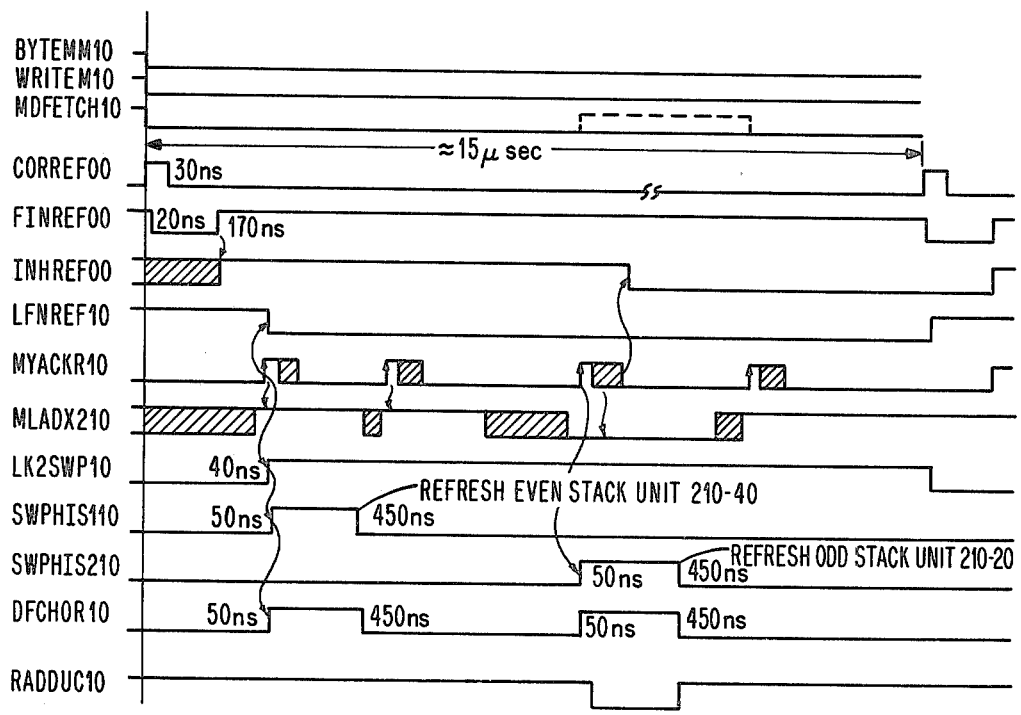

Before discussing an example of operation with reference to FIG. 5c, reference is first made to FIG. 5a. This figure illustrates diagrammatically the relationship between the different clocking signals generated by the circuits of timing section 20 during a single memory cycle of operation. From FIG. 5a, it is seen that the various signals shown are referenced with respect to signal MYACKR10 which starts a memory cycle of operation. It is assumed that the memory command which results in the switching of signal MYACKR10 to a binary ONE, is being directed to a memory location even stack unit 210-2 (i.e., signal MLADX210 is a binary ZERO). The signal MYACKR10 causes memory busy signal MEMBUZ10 to switch to a binary ONE indicating that the memory subsystem has begun a memory cycle of operation (i.e., memory is busy).

As shown, signal DLYINN10 switches to a binary ONE and following the delay established by delay line 204-12 of FIG. 4a, signal DLYWO100 switches to a binary ZERO. This, in turn, results in signal DLYINN10 being forced to a binary ZERO after an interval of 220 nanoseconds, as shown.

Approximately 40 nanoseconds after signal MYACKR10 switches to a binary ONE, the clocking signal MRASTE10 switches to a binary ONE. It will be noted from FIG. 4a that the clocking signal MRASTE10 is generated or derived from the normal clocking signal MRASSN10 which is delayed through the gate circuits of section 204-3. The clocking signal MRASTE10 serves as a row address strobe signal which is applied to the RAM chips of the even stack unit 210-40. This signal is used in a conventional manner to strobe the row address signals from the row address register 207-400 of FIG. 4d.

As seen from FIG. 5a, the clocking signal MCASSN10 is generated a short time thereafter and is derived from timing signal MRASSNTE00, as seen from FIG. 4a. The clocking signal MCASSN10 serves as a column address strobe signal which is applied to the RAM chips of the even stack unit 210-40. In a conventional manner, the normal clocking signals MRASSN10 and MCASSN10 enable the RAM chips of unit 210-40 to latch or store the 7-bit row address signals and column address signals from registers 207-440 and 207-442 respectively.

In a similar fashion, the late clocking signals MRASSL10 and MCASSL10 are used to generate the clocking signals MRAST010 and MCAST010 which are in turn applied to the odd stack unit 210-20. It is seen from FIG. 5a that this other independent set of clocking signals have a timing relationship similar to the normal set of clocking signals. They enable the RAM chips of unit 210-20 to latch the 7-bit row address and column address signals from registers 207-400 and 207-402 respectively.

As seen from FIG. 5a, at the end of a memory cycle, signal MEMBUZTE10 switches from a binary ONE to a binary ZERO forcing memory busy signal MEMBUZ10 to a binary ZERO.

It will be appreciated that a similar sequence of clocking signals are generated when the odd/even address bit signal MLADX210 is a binary ONE. This means, as explained above, that a memory location within the odd stack unit 210-20 is being accessed. Thus, the signal MLADX210 conditions the steering logic circuits 204-3 so as to cause the normal clocking signals MRASSN10 and MCASSN10 to generate the clocking signals MRAST010 and MCAST010 while the late clocking signals MRASSL10 and MCASSL10 generate the clocking signals MRASTE10 and MCASTE10. As mentioned previously, the steering logic circuits 204-3 of FIG. 4a only during a double word pull or fetch operation, enable the transfer of the late set of clocking signals MRASSL10 and MCASSL10 for accessing the second word of a pair of words. However, the steering logic circuits 204-3 enable the transfer of the clocking signal MRASSL10 as explained herein to permit the execution of a hidden or transparent refresh cycle of operation.

Reference will now be made to FIG. 5b which illustrates the timing signals involved during the execution of a refresh cycle of operation by the secondary refresh circuits 205-1 of FIG. 4b. As described above, the circuits 205-1 provide a means of substituting a refresh cycle of operation for a memory cycle of operation. This occurs when the memory subsystem 20 is not in the process of executing a memory cycle, not anticipating any memory cycle or not requesting a cycle and the early refresh request signal REREQA00 has been generated by the circuits 205-1. As seen from FIG. 5b, the 30 nanosecond width pulse signal CORREF00 is generating at 15 microsecond intervals. This signal, in turn, causes the generation of the 150 nanosecond fine refresh timing pulse signal FINREF00.

As seen from FIG. 5b, the leading edge of timing pulse signal CORREF00 sets the early refresh request flip-flop 205-28 while the trailing edge of the fine refresh pulse FINREF00 sets the refresh request flip-flop 205-29 to a binary ONE. This, in turn, causes the switching of the refresh command flip-flop 205-31 to a binary ONE. Thus, the complement of the refresh command signal RECOM00 is a binary ZERO. This signal causes the AND gates 207-52 and 207-54 to force their respective refresh signals OREFCT00 and EREFCT00 to binary ZEROS. When binary ZERO signals are applied to the output control (OC) terminals of the refresh address registers 204-404 and 204-444, this causes the registers to apply their refresh address contents to the odd and even stack units 210-20 and 210-40. Simultaneously, the signals OREFCT00 and EREFCT00 cause the sets of NAND gates 207-80 through 207-83 and 207-84 through 207-87 to force the decode enable signals to binary ONES permitting all four rows of the RAM chips included within each row of the stack units 210-20 and 210-40 to be refreshed.

The end of the refresh cycle of operation is signalled by the leading edge of pulse signal REFRES00 which, in turn, resets to binary ZEROS each of the flip-flops 205-28, 205-29 and 205-31. At the trailing edge of refresh command signal REFCOM10, the AND gate 205-32 forces signal RADDUC10 to a binary ONE, which, in turn, increments by one the address contents of refresh counter 205-33.

It will be noted from FIG. 5b that the refresh command signal REFCOM10 causes the memory busy signal MEMBUZ10 to be forced to a binary ZERO state during the refresh cycle of operation for signalling any unit requesting access to the memory subsystem 20 that the memory is not available for access (i.e., it is busy). Thus, as explained above, the secondary refresh circuits 205-1 during a refresh cycle of operation inhibit access to memory subsystem 20.

By contrast, the primary refresh circuits 205-5 enable refresh cycles of operation to be accomplished in parallel during the execution of certain types of memory operations.

With reference to FIG. 5c, an example illustrating the operation of the apparatus of the subject invention will now be discussed. FIG. 5c illustrates the occurrence of four successive memory requests generated by CPU 40. It will be assumed that CPU 40 is in the process of executing a series of operations which result in the fetching instructions or single word data operands from memory subsystem 20. As previously discussed, the CPU 40 as a consequence of executing each such operation under microprogrammed control is operative to generate the appropriate sequence address signals and control signals corresponding to the set of signals labelled B in FIG. 6 which are applied to bus 10. For each such operation, the states of the signals BYTEMM10, WRITEM10 and MDFETCH10 stored in the register 208-10 of FIG. 4c in response to each command or request are binary ZEROS as illustrated in FIG. 5c.

It will be noted that the generation of requests are asynchronous in nature. In the case of the first request or command, it will be noted that the odd/even address signal MLADX210 derived from the CPU supplied address signals a binary ONE. This means that the memory request or command specifies the accessing of a memory location contained within odd stack unit 210-20.

As discussed above, the first hidden refresh cycle begins in response to the first single word request or command directed to odd stack unit 210-20 after the fine refresh signal FINREF00 switches to a binary ONE. As seen from FIG. 5c, signal FINREF00 is operative to clear the inhibit refresh flip-flop 205-66 to the binary ZERO state forcing signal INHREF00 to a binary ONE.

As seen from FIG. 4c, signal MYACKR10, upon being switched to a binary ONE by CPU 40, clocks or loads the memory command signals applied to bus 10 by CPU 40 into register 208-10. Also, flip-flop 205-62 in response to signal MYACKR10 switches output signal LFNREF10 to a binary ZERO. This forces signal GFNREF00 to a binary ONE. Since the clear input signal GFNREF00 is a binary ONE, and signals MLADX210 and SWPCLK10 are binary ONES, the flip-flop 205-63 switches to a binary ONE forcing output signal LK2SWP10 to a binary ONE, as shown in FIG. 5c.

Single word pull history flip-flop 205-65 is switched to a binary ONE in response to the leading edge of signal LK2SWP10. When set to a binary ONE, this flip-flop indicates that a hidden refresh cycle of operation is to be performed on the even stack unit 210-40 in parallel with the execution of the single word pull operation. Additionally, the complement of signal SWPHIS110 causes NAND gate 205-59 to force the defetch override signal DFCHOR10 to a binary ONE state as seen from FIG. 5c.

It is seen from FIG. 4c that the signal DFCHOR10 causes NAND gate 208-32 to force signal READEV00 to a binary ZERO. This results in AND gates 208-23 and 208-24 forcing the signals MLREAD010 and MRREAD010 to binary ZEROS. These signals which are applied to the read/write lines of even stack unit 210-40 places the unit in a read mode of operation (i.e., it is to perform a read cycle of operation). The other AND gates 208-25 and 208-26 are forced to the appropriate states in accordance with the particular command specified to be executed by the odd stack unit 210-20 (here a read mode). It will be appreciated that the command or operation could have been a write operation with the same results.

At this time, signal DFCHOR00 is a binary ZERO which causes NAND gate 208-35 to force signal DFETCH210 to a binary ONE state. When in this state, this signal enables the steering logic circuits 204-3 to transfer the late clocking signal MRASSL10. This results in the generation of signal MRASTE10 which, in turn, is applied as a row address strobe signal to the RAM chips of the odd stack 210-40.

Referring to FIG. 4d, it is seen that the refresh address signals are derived from the contents of counter 205-33 of FIG. 4c. The refresh address register 207-444, in response to signal EREFCT00, applies its address contents to the input address lines of the even stack unit 210-40. Additionally, signal EREFCT00 causes the address decode section 207-6 to force the clock decode enable signals DRASE010 through DRASE310 to binary ONES. This enables refreshing a given row within all founr rows of the RAM chips within the even stack unit 210-40. That is, the row in every RAM chip is refreshed or restored in a conventional manner with the information contents during the read cycle of operation. At the same time, the signal EREFCT00 causes AND gate 204-85 to inhibit data strobe signal MDOECT10 from being forced to a binary ONE. This, in turn, inhibits the read out of the contents of the addressed memory location within even stack unit 210-40 into even output register 206-10 as a consequence of the refresh cycle of operation. These actions complete the execution of the refresh cycle of operation within the even stack unit 210-40. At the end of the cycle, the timing circuits 204 generate pulse signal RRESET00 which resets flip-flop 205-65 to a binary ZERO state as seen from FIG. 5c.

As seen from FIG. 5c, since the second memory command generated also specifies odd stack unit 210-20 (i.e., signal MLADX210 equals a binary ONE), the primary circuits 205-5 do not execute refresh cycles of operation in parallel with the memory command. However, the third command specifies a memory location within even stack unit 210-40 (i.e., signal MLADX210 is a binary ZERO). Since this memory command does not specify a double word pull or fetch operation (i.e., signal MDFETCH10 is a binary ZERO), the primary refresh circuits 205-5 execute a second hidden refresh cycle of operation involving odd stack unit 210-20.

That is, signal MYACKR10 again forces signal SWPCLK10 to a binary ONE. Thereafter, signals LK2SWP10 and SWPCLK10 cause the single word history flip-flop 205-64 to switch to a binary ONE state. This, in turn, forces signal SWPHIS200 to a binary ZERO causing NAND gate 205-59 to force again the defetch override signal DFCHOR10 to a binary ONE. The actions produced by signal DFCHOR10 are similar to those described previously in connection with the first hidden refresh cycle of operation. That is, the NAND gate 208-33 of FIG. 4c forces signal READOD00 to a binary ZERO. This, in turn, causes AND gates 208-25 and 208-26 to force signals MRREAD110 and MLREAD110 to binary ZEROS which places the odd stack unit 210-20 in a read mode of operation. Also, signal DFCHOR00 forces signal DFETCH210 to a binary ONE which causes the steering logic circuits 204-3 to transfer the late clocking signal MRASSLE10 onto the odd stack unit 210-20. That is, the signal MRASSLE10 generates signal MRAST010 which is applied as an input to the odd stack unit 210-20. This clocks or strobes the address contents of refresh address register 207-404 applied to the address lines of the odd stack unit 210-20 into the RAM chips.

Previously, the single word pull history signal SWPHIS200 caused the AND gate 207-52 to force signal OREFCT00 to a binary ZERO. As mentioned above, this signal enables the address contents of refresh address register 207-404 corresponding to the contents of counter 205-33 to be applied to the address lines of odd stack unit 210-20. also, at that time, signal OREFCT00 caused the address decode section to force the decode enable clocking signals DRAS0010 through DRAS0310 to binary ONES enabling the refreshing of the RAM chips of odd stack unit 210-20.

Since both stack units have been refreshed (i.e., signal SWPHIS210 is a binary ONE), it is seen that the inhibit refresh flip-flop 205-66 is set to a binary ONE at the trailing edge of signal MYACKD10 generated by AND gate 204-50. This results in signal INHREF20 being forced to a binary ZERO which inhibits the early refresh request flip-flop 205-28 and refresh request flip-flop 205-29 from being set. This, in turn, inhibits the secondary refresh circuits 205-1 from executing a refresh cycle of operation during the remainder of the 15 microsecond interval.

Also, signal INHREF00 inhibits further clocking of the flip-flop 205-63 and flip-flop 205-64. At the end of the second hidden refresh cycle, the timing circuits 204 generate pulse signal RRESET00 which resets single word pull history flip-flop 205-64 to a binary ZERO state. At the trailing edge of signal SWHIS210, AND gate 205-32 switches signal RADDUC10 from a binary ZERO to a binary ONE state. This transition causes the address contents of counter 205-33 to be incremented by one to the next address in preparation for a next series of hidden refresh cycles during the next 15 microsecond time interval.

From the above explanation, it is seen how the apparatus of the preferred embodiment of the present invention by utilizing available clocking signals and apparatus included within the memory subsystem 20 constructed to include a double word fetch capability is able to independently refresh the RAM chips of the memory subsystem stack units or memory modules. It will be also appreciated that the terms "stack unit" and/or "memory module" as used herein refer to a unit which is independently operated.

More importantly, the present invention permits such refresh operations to be performed in parallel with certain types of memory operations. As mentioned previously, the memory stack units or memory modules of the memory subsystem are normally operated in an interleaved fashion. This insures that essentially all of the refresh cycles of operation are executable without any interference in normal memory operations. In the event that the memory subsystem is not accessed a sufficient number of times, the secondary refresh circuits operate to refresh the memory modules as required.

Thus, by providing a combination of different types of refresh circuits, refresh operations are performed with a minimum of interference and with no loss in memory data.

It will be appreciated that the apparatus of the present invention enables refresh operations to be executed only during when the memory subsystem is executing certain types of memory commands. For ease of implementation, an odd/even address bit signal was utilized such that a first hidden refresh cycle of operation was initiated in response to accessing a memory location within the stack unit. However, it will be appreciated that with the addition of few circuits, the inclusion of the odd/even address bit becomes no longer necessary.

It will be appreciated by those skilled in the art that many changes may be made to the illustrated embodiment in addition to those mentioned above.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A memory subsystem for use in a system including a processing unit coupled to a bus in common with said subsystem, said unit being operative in response to instructions to generate memory requests on said bus to said subsystem, said requests coded for specifying at least first and second types of memory operations for fetching and storing information within said memory subsystem, said memory subsystem comprising:

at least a pair of independently operated and addressable memory module units, each including a number of addressable arrays of memory cells whose contents must be refreshed within a predetermined time interval, said arrays being divided into a number of rows and columns and each of said memory module units including accessing means for selectively accessing a row within each of said number of arrays and causing the refreshing of all of the memory cells within said row; and, control means coupled to said bus for controlling the operation of said pair of memory module units in response to said memory requests, said control means including:

mandatory refresh control means for refreshing the memory cells of a different one of each of said rows within said arrays within one of a plurality of refresh time intervals evenly distributed throughout said predetermined time interval, said mandatory refresh control means being coupled to said accessing means of each of said pair of independently operated addressable module units for initiating the refresh operation on said different one of each of said rows at the end of said one of said refresh time intervals; and, hidden refresh control means coupled to said mandatory refresh control means and to said accessing means of each of said pair of independently pair of independently operated addressable module units, said hidden refresh control means in response to memory request signals designating said first type of memory operation for fetching or storing said information being operative to selectively condition the accessing means of one of said memory module units to perform a refresh cycle of operation upon one of said different rows of said memory cells of said one memory module in parallel with the accessing of the memory cells of said one of said different rows of the other one of said memory module units and said hidden refresh means including means operative upon performing a predetermined number of refresh cycles of operation upon said different rows within said pair of said memory module units within said refresh time interval to inhibit said mandatory refresh control means for initiating said refresh operation within said one refresh time interval.

2. The memory subsystem of claim 1 wherein said number of arrays is at least equal to two.

3. The memory subsystem of claim 1 wherein said predetermined number of refresh cycles of operation corresponds to performing a refresh cycle of operation upon said memory cells of one of said different rows of each of said memory module units.

4. The memory subsystem of claim 1 wherein each of said access means includes a plurality of address register means operatively coupled to said memory module units associated therewith for applying address signals thereto for independently accessing said memory cells of a storage location.

5. The memory subsystem of claim 4 wherein each of said memory module units includes output register means for receiving the contents of said storage location being accessed in response to said address signals.

6. The memory subsystem of claim 1 wherein said control means further includes:

timing means for selectively providing predetermined sequences of timing signals for performing a memory cycle of operation within each of said memory module units, said predetermined sequences including a first sequence for performing said first type of memory operation and a second sequence for performing a second type of memory operation, said timing means coupled to each of said accessing means, each of said memory module units, said mandatory refresh control means and to said hidden refresh control means, said timing means being conditioned by said signals designating said first type of memory operation to generate timing signals of said second sequence for performing said refresh cycle of operation in parallel with performing a memory cycle of operation upon one of said pair of module units.

7. The memory subsystem of claim 6 wherein said timing means in response to said signals coded to specify said first type of memory operation generates said first sequence of timing signals for accessing only one of said modules and said timing means in response to said signals coded to specify said second type of memory operation generates said second sequence of timing signals for accessing both of said pair of memory module units simultaneously.

8. The memory subsystem of claim 7 wherein said addressable number of arrays of memory cells of each memory module unit are organized into a plurality of word storage locations and wherein said signals coded to specify first type of memory operation cause the fetching or storage of a single word from one of said word storage locations of one of said memory module units and said signals coded to specify said second type of memory operation cause the fetching of a pair of words from one of said word storage locations of each of said memory module units.

9. The memory subsystem of claim 8 wherein said timing means includes timing generator means for generating a series of timing pulses and steering logic means coupled to said timing generator means, to each of said memory module units and to receive signals designating the type of memory operation, said steering logic means being operative to generate said first and second sequences of timing signals for application to said memory module units and said steering logic means being conditioned by said signals when coded to specify said first type of memory operation to apply said first sequence of said timing signals and at least a predetermined one of said timing signals of said second sequence to said memory module units for refreshing the contents of one of said storage locations of one of said memory module units in parallel with accessing one of said module units.

10. The memory subsystem of claim 9 wherein said bus includes a plurality of control lines for receiving coded signals for specifying said first and second types of memory operations and said control means further including read/write command control means for generating individual read and write commands to be applied to each of said memory module units, said read/write command control means including:

register means coupled to said bus for storing said coded signals; and, logic circuit means coupled to said register means and to said hidden refresh control means, said logic circuit means being conditioned by signals from hidden refresh means to generate a read command to said one of said memory module units to perform said refresh cycle of operation in parallel with generating a read or write command to the other one of said memory module units in accordance with said coded signals stored in said register means.

11. The memory subsystem of claim 9 wherein said plurality of address register means includes a refresh address register for storing address signals designating said one of said different rows, said refresh address register being coupled to said hidden refresh control means and said hidden refresh control means conditioning said refresh address register to apply address signals to said memory module unit for refreshing said memory cells of one of said different rows.

12. The memory subsystem of claim 1 wherein said hidden refresh control means in response to said signals coded to specify said first type of memory operation is operative to access a predetermined one of said pair of memory module units to perform said refresh cycle of operation as a first cycle of operation.

13. The memory subsystem of claim 12 wherein said hidden refresh control means in response to signals designating another first type of memory operation is operative to access the memory module unit other than said predetermined one of said pair of memory module units to perform said refresh cycle of operation as a second cycle of operation and said means being operative following each second cycle of operation to inhibit said operation of said mandatory refresh control means during said one refresh time interval.

14. The memory subsystem of claim 1 wherein said hidden refresh means includes:
    gating means for receiving a signal indicative that said first type of memory operation is being requested;
    first and second bistable means connected in series and coupled to said gating means; and
    wherein said means includes output bistable means coupled to said second bistable means and to said gating means, said first and second bistable means being successively conditioned by said gating means to be switched to predetermined states in response to successive memory requests, each specifying said first type of memory operation and said output bistable means being conditioned by said second bistable means when in said predetermined state to generate an output signal for inhibiting said mandatory refresh means.

15. The memory subsystem of claim 14 wherein said processing unit comprises a microprogram controlled unit coupled to said bus, said unit including a plurality of storage locations for storing a corresponding number of microinstructions;
    decoder circuit means coupled to said unit for generating control signals in response to said microinstructions for application to said bus; and,
    register means coupled to said microprogram controlled unit, said register means storing signals corresponding to a program instruction to be executed by said processing unit, said microprogram controlled unit being conditioned by signals included within said instruction to access one of said microinstructions and said decoder circuit means being operative in response to said one microinstruction to generate said signals coded to specify said type of memory operation.

16. A memory subsystem comprising:
    first and second independently operated memory module units, each module including:
        a number of arrays of addressable memory cells arranged to provide a number of storage locations whose information contents must be restored within a predetermined time interval;
        addressing means including a plurality of address registers, said plurality of address registers operatively coupled to said arrays for accessing said number of storage locations; and
        output register means coupled to said arrays for receiving information read out from or to be written into a storage location during a memory cycle of operation;
    timing means coupled to each of said memory modules for generating sequences of timing signals for reading out or writing information from or into a storage location during said memory cycle of operation;
    refresh control means coupled to said timing means and to said address means of each of said memory modules; and,
    read/write command control means coupled to said timing means, said refresh control means and to each of said memory modules, said control means including register means for storing signals representative of memory commands received by said subsystem, said signals being coded to specify at least first and second types of memory information transfer operations for reading/writing information from/into said pair of memory modules, said read/write control means including gating means coupled to said register means operative in response to said signals coded to specify a first type of memory information transfer operation to condition said refresh control means, said timing means and the addressing means of one of said modules to refresh one of said storage locations within said one module by altering said sequences of timing signals generated by said timing means and by enabling said addressing means of said one module to access said one storage location simultaneously with accessing one of said storage locations of the other one of said modules.

17. The memory subsystem of claim 16 wherein said refresh control means includes:
    first refresh control means for refreshing the memory cells of a different one of each of said rows within said arrays within one of a plurality of refresh time intervals evenly distributed throughout said predetermined time interval, said first refresh control means being coupled to said addressing means of each of said pair of independently operated addressable modules for initiating the refresh operation on said different one of each of said rows at the end of said one of said refresh time intervals; and,
    second refresh control means coupled to said first refresh control means and to said addressing means of each of said pair of independently pair of independently operated addressable modules, said second refresh control means in response to signals designating first type of memory operation being operative to selectively condition the addressing means of one of said memory modules to perform a refresh cycle of operation upon one of said different rows of said memory cells in parallel with the accessing of the memory cells of said one of said different rows of the other one of said memory modules and said second refresh means including means operative upon performing a predetermined number of refresh cycles of operation upon said different rows within said pair of said memory modules within said refresh time interval to inhibit said first refresh control means from initiating said refresh operation within said one refresh time interval.

18. The memory subsystem of claim 17 wherein said number of arrays is at least equal to two.

19. The memory subsystem of claim 17 wherein said predetermined number of refresh cycles of operation corresponds to performing a refresh cycle of operation upon said memory cells of one of said different rows of each of said memory modules.

20. The memory subsystem of claim 17 wherein said timing means in response to said signals coded to specify said first type of memory information transfer operation generates said first sequence of timing signals for accessing only one of said modules and said timing means in response to said signals coded to specify said second type of memory information transfer operation generates said second sequence of timing signals for accessing both of said pair of memory modules simultaneously.

21. The memory subsystem of claim 20 wherein said addressable number of arrays of memory cells of each memory module are organized into a plurality of word storage locations and wherein said signals coded to specify first type of memory transfer operation cause the fetching or storage of a single word from one of said word storage locations of one of said memory modules and said signals coded to specify said second type of memory transfer operation cause the fetching of a pair of words from one of said word storage locations of each of said memory modules.

22. The memory subsystem of claim 20 wherein said timing means includes timing generator means for generating a series of timing pulses and steering logic means coupled to said timing generator means, to each of said memory modules and to receive said signals, said steering logic means being operative to generate said first and second sequences of timing signals for application to said memory modules and said steering logic means being conditioned by said signals when coded to specify said first type of memory operation to alter said sequences by applying said first sequence of said timing signals and at least a predetermined one of said timing signals of said second sequence to said memory modules for refreshing the contents of one of said storage locations of one of said memory modules in parallel with accessing the other of said modules.

23. The memory subsystem of claim 17 wherein said read/write command control means includes:
register means coupled to store said signals coded to specify said types of memory information transfer operations; and,
logic circuit means coupled to said register means and to said primary refresh control means, said logic circuit means being conditioned by signals from primary refresh means to generate a read command to said one of said memory modules to perform said refresh cycle of operation in parallel with generating a read or write command to the other one of said memory modules in accordance with said coded signals stored in said register means.

24. The memory subsystem of claim 17 wherein said plurality of address registers includes a refresh address register for storing address signals designating said one of said different rows, said refresh address register being coupled to said primary refresh control means and said primary refresh control means conditioning said refresh address register to apply address signals to said memory module for refreshing said memory cells of one of said different rows.

25. The memory subsystem of claim 17 wherein said second refresh control means in response to said signals coded to specify said first type of memory operation is operative to access a predetermined one of said pair of memory modules to perform said refresh cycle of operation as a first cycle of operation.

26. The memory subsystem of claim 25 wherein said second refresh control means in response to signals designating another first type of memory operation is operative to access the memory module other than said predetermined one of said pair of memory modules to perform said refresh cycle of operation as a second cycle of operation and said means being operative following each second cycle of operation to inhibit said operation of said first refresh control means during said one refresh time interval.

27. The memory subsystem of claim 17 wherein said second refresh means includes:
gating means for receiving a signal indicative that said first type of memory operation is being requested;
first and second bistable means connected in series and coupled to said gating means; and
wherein said means includes output bistable means coupled to said second bistable means and to said gating means, said first and second bistable means being successively conditioned by said gating means to be switched to predetermined states in response to successive memory requests, each specifying said first type of memory operation and said output bistable means being conditioned by said second bistable means when in said predetermined state to generate an output signal for inhibiting said first refresh control means.

28. A memory subsystem for use in a system including a processing unit coupled to a bus in common with said subsystem, said unit being operative in response to instructions to generate memory requests on said bus to said subsystem, said requests coded for specifying at least first and second types of memory operations for fetching and storing information within said memory subsystem, said memory subsystem comprising:
at least a pair of independently operated and addressable memory modules, each including at least one independently addressable array of memory cells whose contents must be refreshed within a predetermined time interval, said array being divided into a number of rows and columns and each of said memory modules including accessing means for selectively accessing a row within said array and causing the refreshing of all of the memory cells within said row; and,
control means coupled to said bus for controlling the operation of said pair of memory modules in response to said memory requests, said control means including:
primary refresh control means coupled to said accessing means of each of said pair of independently pair of independently operated addressable modules, said primary refresh control means in response to memory request signals received from said bus designating first type of memory operation for fetching or storing said information selectively conditioning the accessing means of one of said memory module units to perform a refresh cycle of operation upon one of said different rows of said memory cells in parallel with the accessing of the memory cells of said one of said different rows of the other one of said memory modules and said primary refresh means including means operative upon performing a predetermined number of refresh cycles of operation upon said different rows within said pair of said memory modules within said refresh time interval to generate a control signal; and, secondary refresh control means for refreshing the memory cells of a different one of each of said rows within said arrays within one of a plurality of refresh time intervals evenly distributed throughout said predetermined time interval, said secondary refresh control means being coupled to said primary refresh control means and to said accessing means of each of said pair of independently operated addressable modules for initiating the refresh operation on said different one of each of said rows at the end of said one of said refresh time intervals, and said secondary refresh control means being conditioned by said control signal to inhibit the initiation of said refresh operation within said one refresh time interval.

29. The memory subsystem of claim 28 wherein said predetermined number of refresh cycles of operation corresponds to performing a refresh cycle of operation upon said memory cells of one of said different rows of each of said memory modules.

30. The memory subsystem of claim 28 wherein said control means further includes:

timing means for selectively providing predetermined sequences of timing signals for performing a memory cycle of operation within each of said memory modules, said predetermined sequences including a first sequence for performing a said first type of memory operation and a second sequence for performing a second type of memory operation, said timing means coupled to each of said accessing means, each of said memory modules, said primary refresh control means and to said secondary refresh control means, said timing means being conditioned by said signals designating said first type of memory operation to generate timing signals of said second sequence for performing said refresh cycle of operation in parallel with performing a memory cycle of operation upon one of said pair of modules.

31. The memory subsystem of claim 30 wherein said timing means in response to said signals coded to specify said first type of memory operation generates said first sequence of timing signals for accessing only one of said modules and said timing means in response to said signals coded to specify said second type of memory operation generates said second sequence of timing signals for accessing both of said pair of memory modules simultaneously.

32. The memory subsystem of claim 31 wherein said addressable array of memory cells of each memory module are organized into a plurality of word storage locations and wherein said signals coded to specify first type of memory operation cause the fetching or storage of a single word from one of said word storage locations of one of said memory modules and said signals coded to specify said second type of memory operation cause the fetching of a pair of words from one of said word storage locations of each of said memory modules.

33. The memory subsystem of claim 32 wherein said bus includes a plurality of control lines for receiving coded signals for specifying said first and second types of memory operations and said control means further including read/write command control means for generating individual read and write commands to be applied to each of said memory modules, said read/write command control means including:

register means coupled to said bus for storing said coded signals; and, logic circuit means coupled to said register means and to said primary refresh control means, said logic circuit means being conditioned by signals from primary refresh means to generate a read command to said one of said memory modules to perform said refresh cycle of operation in parallel with generating a read or write command to the other one of said memory modules in accordance with said coded signals stored in said register means.

34. The memory subsystem of claim 32 wherein said plurality of address register means includes a refresh address register for storing address signals designating said one of said different rows, said refresh address register being coupled to said primary refresh control means and said primary refresh control means conditioning said refresh address register to apply address signals to said memory module for refreshing said memory cells of one of said different rows.

35. The memory subsystem of claim 28 wherein said primary refresh control means in response to said signals coded to specify said first type of memory operation is operative to access a predetermined one of said pair of memory modules to perform said refresh cycle of operation as a first cycle of operation.

36. The memory subsystem of claim 35 wherein said primary refresh control means in response to signals designating another first type of memory operation is operative to access the memory module other than said predetermined one of said pair of memory modules to perform said refresh cycle of operation as a second cycle of operation and said means being operative following each second cycle of operation to generate said control signal inhibiting the operation of said secondary refresh control means during said one refresh time interval.

37. The memory subsystem of claim 28 wherein said primary refresh means includes:

gating means for receiving a signal indicative that said first type of memory operation is being requested;

first and second bistable means connected in series and coupled to said gating means; and wherein said means includes output bistable means coupled to said second bistable means and to said gating means, said first and second bistable means being successively conditioned by said gating means to be switched to predetermined states in response to successive memory requests, each specifying said first type of memory operation and said output bistable means being conditioned by said second bistable means when in said predetermined state to generate said output control signal for inhibiting the operation of said secondary refresh means.

38. The memory subsystem of claim 32 wherein said timing means includes timing generator means for generating a series of timing pulses and steering logic means coupled to said timing generator means, to each of said memory modules and to receive signals designating the type of memory operation, said steering logic means being operative to generate said first and second sequences of timing signals for application to said memory modules and said steering logic means being conditioned by said signals when coded to specify said first type of memory operation to apply said first sequence of said timing signals and at least a predetermined one of said timing signals of said second sequence to said memory modules for refreshing the contents of one of said storage locations of one of said memory modules in parallel with accessing another one of said memory modules.

* * * * *